United States Patent
Park et al.

(10) Patent No.: US 10,101,660 B2
(45) Date of Patent: Oct. 16, 2018

(54) METHODS OF FORMING PATTERNS OF SEMICONDUCTOR DEVICES

(71) Applicants: Jeong-Ju Park, Hwaseong-si (KR); Seung-Chul Kwon, Suwon-si (KR); Eun-Sung Kim, Seoul (KR); Kyeong-Mi Lee, Suwon-si (KR); Shi-Yong Yi, Seongnam-si (KR); Tsuyosh Kurosawa, Kanagawa-ken (JP); Katsumi Ohmori, Kanagawa-ken (JP); Tasuku Matsumiya, Kanagawa-ken (JP)

(72) Inventors: Jeong-Ju Park, Hwaseong-si (KR); Seung-Chul Kwon, Suwon-si (KR); Eun-Sung Kim, Seoul (KR); Kyeong-Mi Lee, Suwon-si (KR); Shi-Yong Yi, Seongnam-si (KR); Tsuyosh Kurosawa, Kanagawa-ken (JP); Katsumi Ohmori, Kanagawa-ken (JP); Tasuku Matsumiya, Kanagawa-ken (JP)

(73) Assignees: Samsung Electronics Co., Ltd., Suwon-Si, Gyeonggi-do (KR); Tokyo Ohka Kogyo Co., Ltd., Kawasaki, Kanagawa (JP)

( * ) Notice: Subject to any disclaimer, the term of this patent is extended or adjusted under 35 U.S.C. 154(b) by 0 days.

(21) Appl. No.: 15/345,910

(22) Filed: Nov. 8, 2016

(65) Prior Publication Data
US 2017/0129972 A1    May 11, 2017

(30) Foreign Application Priority Data

Nov. 11, 2015 (KR) .......................... 10-2015-0158213

(51) Int. Cl.
*G03F 7/004* (2006.01)
*G03F 7/16* (2006.01)
(Continued)

(52) U.S. Cl.
CPC .............. *G03F 7/165* (2013.01); *B82Y 10/00* (2013.01); *B82Y 40/00* (2013.01); *C08F 20/28* (2013.01);
(Continued)

(58) Field of Classification Search
CPC .... G03F 7/0002; G03F 7/0035; G03F 7/2059; G03F 7/40; G03F 7/165; G03F 7/2022;
(Continued)

(56) References Cited

U.S. PATENT DOCUMENTS 8,114,306 B2    2/2012   Cheng et al.
8,263,323 B2    9/2012   Yoon et al.
(Continued)

*Primary Examiner* — Amanda C. Walke
(74) *Attorney, Agent, or Firm* — Lee & Morse, P.C.

(57) ABSTRACT

In a method of forming patterns, an object layer is formed on a substrate. Guide patterns are formed on the object layer. A brush layer is formed using a brush polymer on surfaces of the guide patterns. The brush polymer includes at least one of a first brush polymer and a second brush polymer. The first brush polymer includes a hydrophobic repeating unit and a hydrophilic terminal group having at least two hydroxyl groups. The second brush polymer includes a hydrophobic repeating unit and a hydrophilic random repeating unit having a hydroxyl group. A self-aligned layer is formed using a block copolymer on the brush layer to form blocks aligned around the guide patterns. At least a portion of the blocks is transferred to the object layer.

15 Claims, 36 Drawing Sheets

(51) Int. Cl.
  *H01L 27/108* (2006.01)
  *C08F 20/28* (2006.01)
  *B82Y 10/00* (2011.01)
  *B82Y 40/00* (2011.01)
  *C08L 53/00* (2006.01)
  *G03F 7/20* (2006.01)
  *G03F 7/00* (2006.01)
  *G03F 7/40* (2006.01)
  *H01L 21/033* (2006.01)
  *H01L 21/311* (2006.01)
  *H01L 21/3213* (2006.01)
  *H01L 49/02* (2006.01)

(52) U.S. Cl.
  CPC ............ *C08L 53/00* (2013.01); *G03F 7/0002* (2013.01); *G03F 7/0035* (2013.01); *G03F 7/2022* (2013.01); *G03F 7/2059* (2013.01); *G03F 7/40* (2013.01); *H01L 21/0337* (2013.01); *H01L 21/31144* (2013.01); *H01L 21/32139* (2013.01); *H01L 27/10844* (2013.01); *H01L 28/00* (2013.01); *B81C 2201/0149* (2013.01)

(58) Field of Classification Search
  CPC ........... H01L 21/0274; H01L 21/02112; H01L 21/3065; H01L 21/0392; B82Y 10/00; B82Y 40/00; C08L 53/00; C08L 153/00
  USPC .... 430/270.1, 311, 313, 314, 317, 322, 325, 430/329, 330, 331, 296, 323; 438/700, 438/689, 711, 699, 781; 216/47, 51
  See application file for complete search history.

(56) References Cited

U.S. PATENT DOCUMENTS

| | | | |
|---|---|---|---|
| 8,501,304 B2* | 8/2013 | Stoykovich | B81C 1/00031 428/195.1 |
| 8,512,846 B2 | 8/2013 | Millward | |
| 8,636,914 B2 | 1/2014 | Nakamura et al. | |
| 8,673,541 B2 | 3/2014 | Xiao et al. | |
| 9,023,222 B2 | 5/2015 | Kawanishi et al. | |
| 9,183,870 B2* | 11/2015 | Nealey | B81C 1/00031 |
| 9,574,104 B1* | 2/2017 | Kim | G03F 7/40 |
| 9,704,722 B2* | 7/2017 | Park | H01L 21/31144 |
| 2011/0147983 A1* | 6/2011 | Cheng | B81C 1/00031 264/220 |
| 2012/0076978 A1* | 3/2012 | Millward | B81C 1/00031 428/120 |
| 2012/0196089 A1 | 8/2012 | Yang et al. | |
| 2014/0205818 A1 | 7/2014 | Schwartz et al. | |
| 2014/0322917 A1* | 10/2014 | Abdallah | H01L 21/3081 438/703 |
| 2014/0335454 A1 | 11/2014 | Trefonas, III et al. | |
| 2014/0360975 A1 | 12/2014 | Hustad et al. | |
| 2014/0370712 A1 | 12/2014 | Kim et al. | |
| 2015/0010869 A1 | 1/2015 | Peeters et al. | |
| 2015/0044874 A1* | 2/2015 | Matsunaga | H01L 21/0337 438/702 |
| 2015/0104946 A1* | 4/2015 | Park | H01L 21/0337 438/703 |
| 2015/0118851 A1 | 4/2015 | Gao et al. | |
| 2015/0287592 A1* | 10/2015 | Park | G03F 7/0002 438/702 |
| 2016/0194751 A1* | 7/2016 | Yahagi | C09D 153/00 427/372.2 |
| 2016/0238938 A1* | 8/2016 | Ban | C08F 293/00 |

* cited by examiner

METHODS OF FORMING PATTERNS OF SEMICONDUCTOR DEVICES

CROSS-REFERENCE TO RELATED APPLICATION

Korean Patent Application No. 10-2015-0158213, filed on Nov. 11, 2015, in the Korean Intellectual Property Office, and entitled: "Methods of Forming Patterns of Semiconductor Devices and Methods of Manufacturing Semiconductor Devices," is incorporated by reference herein in its entirety.

BACKGROUND

1. Field

Embodiments relate to methods of forming patterns of semiconductor devices and methods of manufacturing semiconductor devices.

2. Description of the Related Art

In general photolithography, an exposure device has been developed for forming fine and minute patterns. However, a pattern having a specific critical limit may be difficult to obtain due to a resolution limit. Thus, a double patterning method (e.g., using at least two different masks) has been considered but such a method may be complicated and costly.

SUMMARY

Embodiments are directed to a method of forming patterns that includes forming an object layer on a substrate, forming guide patterns on the object layer, forming a brush layer using a brush polymer on surfaces of the guide patterns, the brush polymer including at least one of a first brush polymer or a second brush polymer, the first brush polymer including a hydrophobic repeating unit and a hydrophilic terminal group having at least two hydroxyl groups, the second brush polymer including a hydrophobic repeating unit and a hydrophilic random repeating unit having a hydroxyl group, forming a self-aligned layer using a block copolymer on the brush layer to form blocks aligned around the guide patterns, wherein the block copolymer includes a first polymer unit and a second polymer unit, the first polymer unit being assembled into first blocks arranged in a grid shape or a honeycomb shape around the guide patterns, the second polymer unit being assembled into second blocks contacting the brush layer and surrounding sidewalls of the first blocks, and transferring at least a portion of the blocks to the object layer.

Embodiments are also directed to a method of forming patterns that includes forming an object layer on a substrate, forming guide patterns on the object layer, forming a brush layer covering surfaces of the guide patterns, forming a self-aligned layer on the brush layer using a blend, the blend including a lamellar-type block copolymer including a first polymer unit and a second polymer unit, a first homopolymer including the first polymer unit, and a second homopolymer including the second polymer unit, thermally curing the self-aligned layer to form first blocks including the first polymer unit and a second block including the second polymer unit, the first blocks being aligned around guide pattern in a honeycomb shape and each first block having a pillar shape, the second block contacting the brush layer and surrounding the first blocks, and transferring the first blocks to the object layer.

Embodiments are also directed to a method of forming patterns that includes forming an object layer on a substrate, forming guide patterns on the object layer, forming a brush layer on surfaces of the guide patterns using a brush polymer, the brush polymer including a hydrophobic repeating unit and a hydrophilic unit that includes a plurality of hydroxyl groups, forming a self-aligned layer on the brush layer using a blend of a block copolymer and homopolymers, wherein the block copolymer includes a first polymer unit and a second polymer unit, the first polymer unit being assembled into first blocks arranged in a grid shape or a honeycomb shape around the guide patterns, the second polymer unit being assembled into second blocks contacting the brush layer and surrounding sidewalls of the first blocks, removing a portion of the self-aligned layer to form holes, and transferring the holes to the object layer.

Embodiments are also directed to a method of manufacturing a semiconductor device that includes forming a plurality of active patterns defined by an isolation layer, forming gate structures on the active patterns, forming an insulating interlayer covering the gate structures on the active patterns, forming guide patterns on the insulating interlayer, forming a brush layer using a brush polymer on surfaces of the guide patterns, the brush polymer including at least one of a first brush polymer or a second brush polymer, the first brush polymer including a hydrophobic repeating unit and a hydrophilic terminal group having at least two hydroxyl groups, the second brush polymer including a hydrophobic repeating unit and a hydrophilic random repeating unit having a hydroxyl group, forming a self-aligned layer using a block copolymer on the brush layer to form blocks aligned around the guide patterns, wherein the block copolymer includes a first polymer unit and a second polymer unit, the first polymer unit being assembled into first blocks arranged in a grid shape or a honeycomb shape around the guide patterns, the second polymer unit being assembled into second blocks contacting the brush layer and surrounding sidewalls of the first blocks, and transferring at least a portion of the blocks to the insulating interlayer to form contact holes through which the active patterns are partially exposed.

Embodiments are also directed to a composition for forming a hydrophobic brush layer that includes a brush polymer including at least one of a first brush polymer or a second brush polymer, the first brush polymer including a hydrophobic repeating unit and a hydrophilic terminal group having at least two hydroxyl groups, the second brush polymer including a hydrophobic repeating unit and a hydrophilic random repeating unit having a hydroxyl group, and a solvent.

BRIEF DESCRIPTION OF THE DRAWINGS

Features will become apparent to those of skill in the art by describing in detail example embodiments with reference to the attached drawings in which.

DETAILED DESCRIPTION

Figure 1:
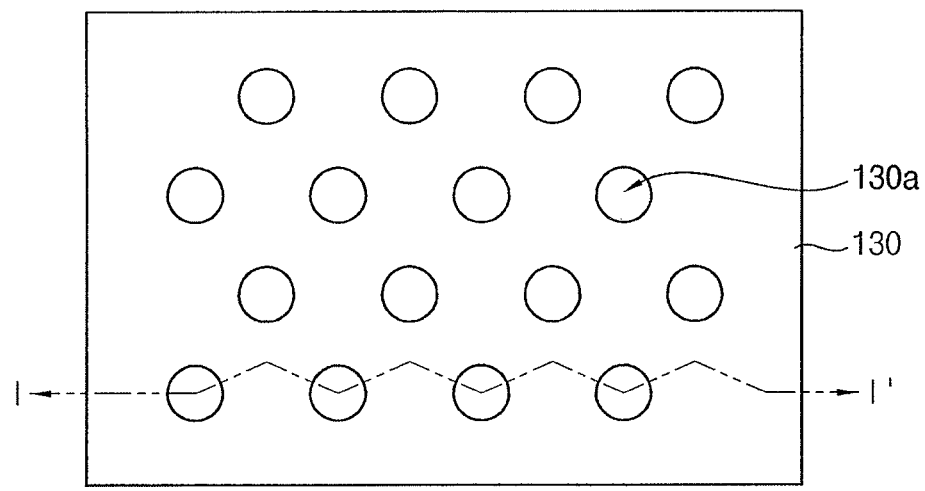
FIGS. 1 to 17 illustrate top plan views and cross-sectional views illustrating a method of forming patterns of a semiconductor device in accordance with example embodiments.

Example embodiments are described herein with reference to the drawings. Embodiments may, however, be embodied in different forms and should not be construed as limited to the example embodiments set forth herein. Rather, these example embodiments are provided so that this description will be thorough and complete, and will fully convey the scope of the present application to those skilled in the art. In the drawings, sizes of layers and regions may be exaggerated for clarity. Like numerals refer to like elements throughout.

FIGS. 1 to 17 are top plan views and cross-sectional views illustrating a method of forming patterns of a semiconductor device in accordance with example embodiments. FIGS. 1, 3, 5, 7, 9, 11, and 13 are top plan views illustrating the method. FIGS. 2, 4, 6, 8, 10, 12, and 14 to 17 are cross-sectional views taken along lines I-I' indicated in the top plan views.

Figure 2:
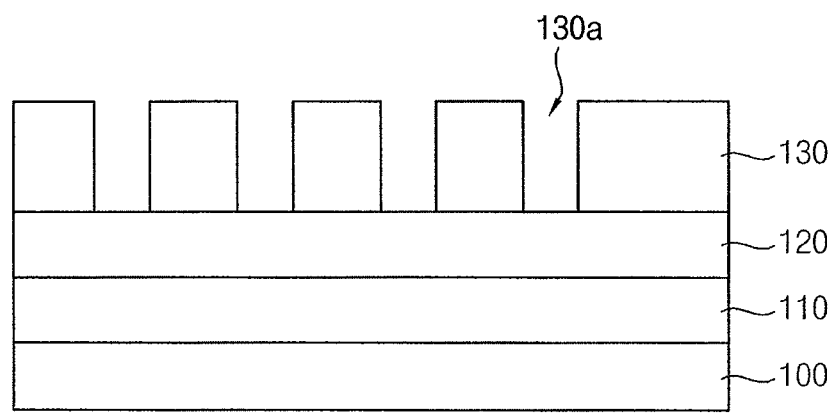

Referring to FIGS. 1 and 2, an object layer 110, an intermediate layer 120, and a sacrificial pattern 130 may be sequentially formed on a substrate 100. The substrate 100 may include silicon, germanium, silicon-germanium or a group III-V compound such as GaP, GaAs, GaSb, etc. The substrate 100 may be a silicon-on-insulator (SOI) substrate or a germanium-on-insulator (GOI) substrate.

The object layer 110 may be partially etched by a subsequent process to be converted into a pattern including a plurality of openings or contact holes. The object layer 110 may be formed of a silicon oxide-based material such as plasma enhanced oxide (PEOX), tetraethyl orthosilicate (TEOS) or flowable oxide (FOX). The object layer 110 may be formed of a conductive material such as doped polysilicon, a metal, a metal nitride, and/or a metal silicide.

The intermediate layer 120 may be formed of a material having an etching selectivity with respect to the object layer 110. The intermediate layer 120 may be formed of silicon nitride, silicon oxynitride, silicon carbonitride, and/or silicon carbide. The intermediate layer 120 may serve as an etch-stop layer or an etching mask layer for the object layer 110. The intermediate layer 120 may be formed as a multi-layered structure. For example, the intermediate layer 120 may also include an anti-reflective layer.

The sacrificial pattern 130 may be formed of a material having an etching selectivity with respect to the intermediate layer 120 and a guide layer 140 (see FIGS. 5 and 6) formed by a subsequent process, for example, a silicon-based or carbon-based spin-on hardmask (SOH) materials. The sacrificial pattern 130 may include a plurality of guiding holes 130a therein, which may provide spaces for guide patterns 145 (see FIGS. 7 and 8) formed by a subsequent process. A sacrificial layer may be formed on the intermediate layer 120 using the SOH material, and a photolithography process utilizing a photoresist may be performed on the sacrificial layer to form the sacrificial pattern 130 including the guiding holes 130a. The sacrificial pattern 130 may include a photoresist material. A photoresist layer may be formed on the intermediate layer 120, and the photoresist layer may be partially removed by exposure and developing processes to form the sacrificial pattern 130 including the guiding holes 130a.

As illustrated in FIG. 1, the guiding holes 130a may be formed in a zigzag arrangement in a plane view. A plurality of the guiding holes 130a may be arranged in a lateral direction to form a guiding hole row, and a plurality of the guiding hole rows may be arranged in a vertical direction such that the guiding holes 130a included in different guiding hole rows may face each other in a staggered arrangement.

The object layer 110, the intermediate layer 120 and the sacrificial pattern 130 may be formed by, e.g., a physical vapor deposition process, a chemical vapor deposition process, an atomic layer deposition process, a sputtering process, a spin coating process, etc.

Figure 3:
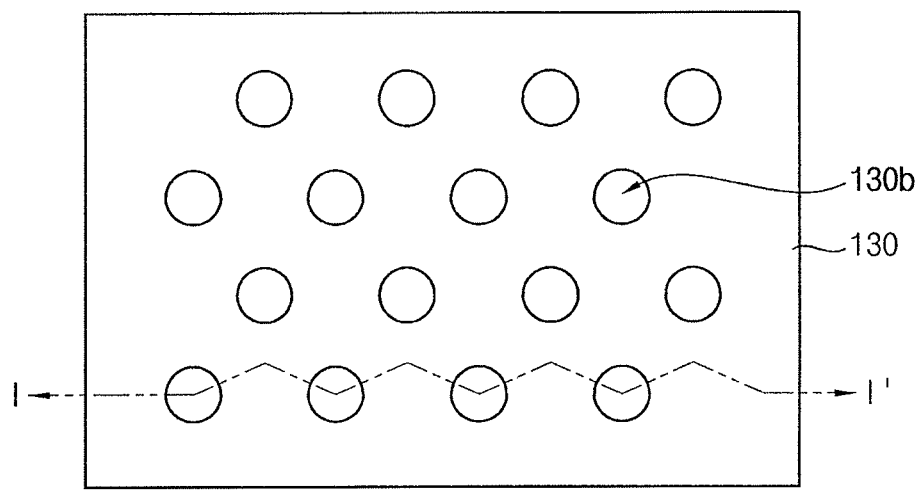
Figure 4:
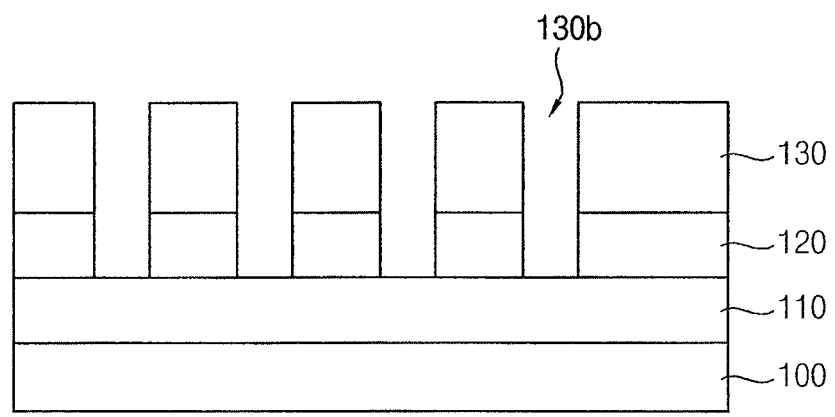

Referring to FIGS. 3 and 4, the intermediate layer 120 may be partially removed using the sacrificial pattern 130 as an etching mask. Thus, an extended guiding hole 130b may be formed from the guiding hole 130a. A top surface of the object layer 110 may be exposed through the extended guiding hole 130b. An etch-stop layer including, e.g., silicon nitride may be further formed between the object layer 110 and the intermediate layer 120. In this case, a top surface of the etch-stop layer may be exposed through the extended guiding hole 130b.

Figure 5:
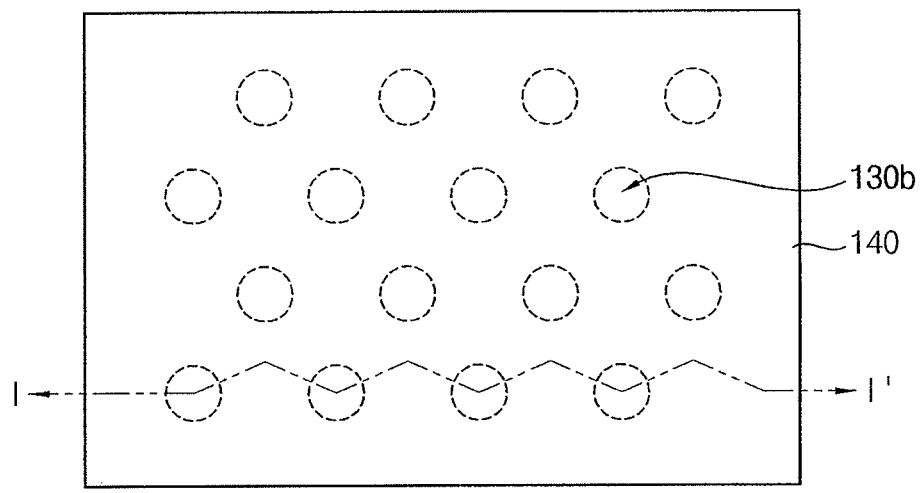
Figure 6:
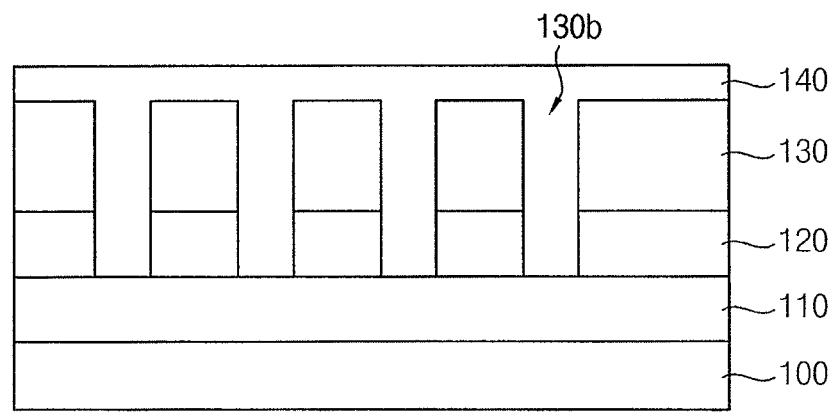

Referring to FIGS. 5 and 6, the guide layer 140 filling the extended guiding holes 130b may be formed on the sacrificial pattern 130. The guide layer 140 may include a hydrophilic material. For example, the guide layer 140 may be formed of an oxide-based material such as an atomic layer deposition oxide, a middle temperature oxide (MTO) or a high temperature oxide (HTO). The guide layer 140 may be formed of an inorganic material such as silicon oxide, silicon oxynitride or silicon nitride.

Figure 7:
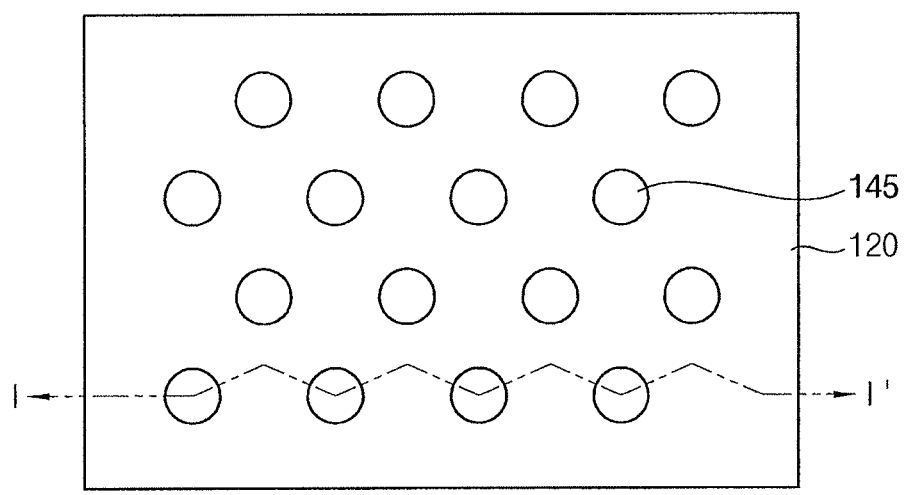
Figure 8:
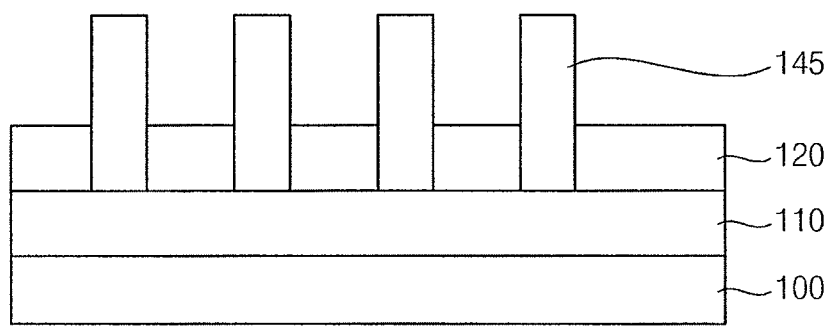

Referring to FIGS. 7 and 8, the guide patterns 145 may be formed from the guide layer 140, and the sacrificial pattern 130 may be removed. An upper portion of the guide layer 140 may be planarized by a chemical mechanical polish process until a top surface of the sacrificial pattern 130 is exposed. Accordingly, the guide layer 140 may be separated per each extended guide hole 140 to form the guide pattern 145. The sacrificial pattern 130 may be removed by an ashing process and/or a strip process. Accordingly, the guide pattern 145 may be partially buried in the intermediate layer 120, and may protrude from the top surface of the intermediate layer 120. The guide pattern 145 may serve as a guiding pillar.

A plurality of the guide patterns 145 may be arranged according to the arrangement of the guiding holes 130a as described above. A guide pattern row may be formed along the lateral direction, and a plurality of the guide pattern rows may be arranged along the vertical direction such that the guide patterns 145 may face each other in a zigzag arrangement.

Figure 9:
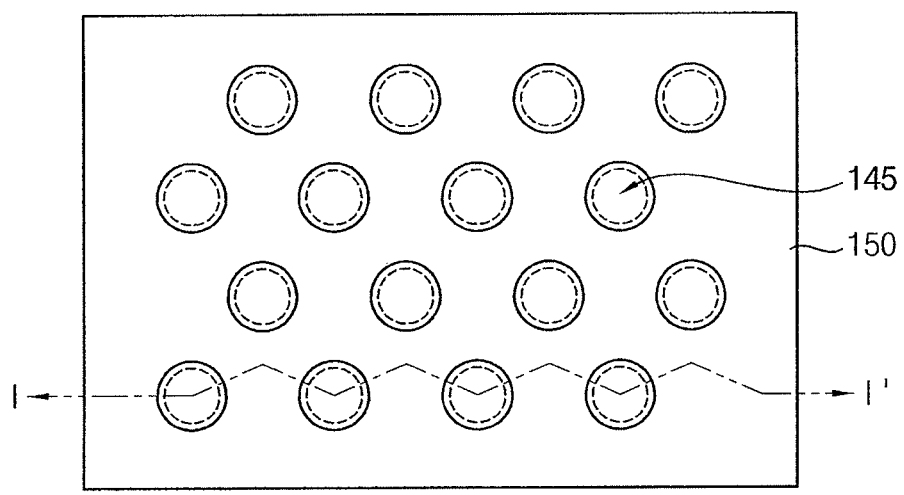
Figure 10:
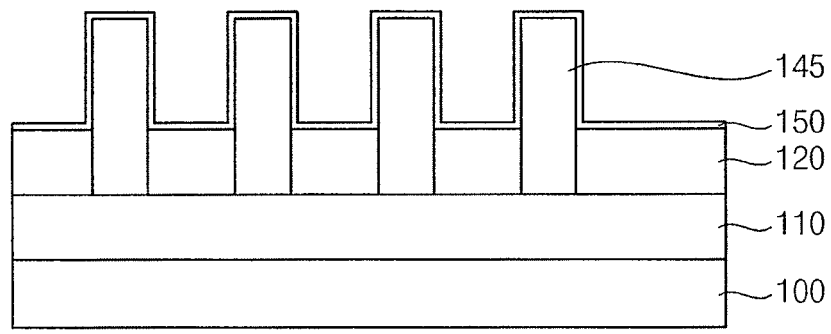

Referring to FIGS. 9 and 10, a brush layer 150 may be formed conformally on the intermediate layer 120 and surfaces of the guide patterns 145. The brush layer 150 may be formed using a brush polymer including a hydrophobic unit as a main repeating unit and an additional hydrophilic unit.

The brush layer 150 may be formed using a brush polymer composition that may include the brush polymer and a solvent by, e.g., a spin coating process and a thermal curing process. The solvent may include an organic solvent. The organic solvent may include, e.g., an acetate-based solvent, an ether-based solvent, a propionate-based solvent or a lactone-based solvent. For example, the solvent may include a propylene glycol monomethyl ether acetate, propylene glycol monomethyl ether, ethyl 3-ethoxy propionate, ethyl lactate, methyl 2-hydroxy-2-methyl propionate, gamma-butyrolactone, etc.

The hydrophobic unit of the brush polymer may be a styrene unit, and thus the brush polymer may have polystyrene (PS) structure. The hydrophilic unit may include at least two hydroxyl groups, and may be included in the brush polymer as a terminal group. Hereinafter, the brush polymer that may include the hydrophobic unit and a hydrophilic terminal group having the at least two hydroxyl groups is referred to as a first brush polymer. The hydrophilic unit may be a diol terminal group, and the first brush polymer may have a PS-diOH structure.

The hydrophobic unit and the hydrophilic unit may be represented by the following Chemical Formulae 1 and 2, respectively. Asterisks represent bonding points to other portions of the molecule.

[Chemical Formula 1]

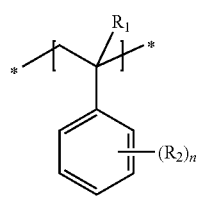

[Chemical Formula 2]

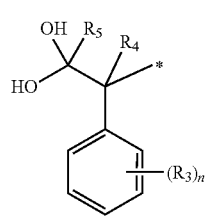

In Chemical Formulae 1 and 2, $R_1$ and $R_4$ may be independently hydrogen, a C1-C6 alkyl group, or a C1-C6 halogenated alkyl group. $R_2$ and $R_3$ may be independently a halogen atom, an oxygen atom, a C1-C20 alkyl group or a cycloalkyl group, e.g., a C1-C20 cycloalkyl group, or a C1-C20 alkyl group or a cycloalkyl group, e.g., a C1-C20 cycloalkyl group, that may include a halogen substitution group or may be partially substituted with a silicon atom. $R_5$ may be a hydroxyl group or hydrogen, and n may be an integer of 0 and 5.

In Chemical Formula 2, when $R_5$ is the hydroxyl group, the hydrophilic unit may serve as a triol-type terminal group, and the first brush polymer may have a PS-triOH structure.

The first brush polymer may be represented by the following Chemical Formula 3.

[Chemical Formula 3]

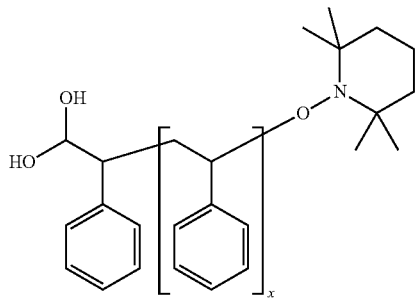

A weight average molecular weight of the first brush polymer may be about 1,000 to about 100,000, and integer "x" may be adjusted such that the first brush polymer may have the weight average molecular weight of the above range. If the weight average molecular weight of the first brush polymer is less than about 1,000, the brush layer 150 having a uniform thickness may not be obtained. If the weight average molecular weight of the first brush polymer exceeds about 100,000, a thickness of the brush layer 150 may excessively increase.

A reaction temperature at which the first brush polymer may be reacted with the guide pattern 145 and stabilized may be about 150° C. to about 250° C. In an embodiment, the reaction temperature may be about 150° C. to about 210° C.

The hydrophilic unit may include a hydroxyl group, and may be included in the brush polymer as a random repeating unit. Thus, the brush polymer may be a random copolymer of the hydrophobic unit and the hydrophilic unit (e.g., hydrophobic unit-r-hydrophilic unit). Hereinafter, the brush polymer including the hydrophilic unit as the random repeating unit may be referred to as a second brush polymer.

The hydrophilic unit may include a hydroxy-alkyl methacrylate unit. The hydrophobic unit may be represented by the above Chemical Formula 1, and the hydrophilic unit may be represented by the following Chemical Formula 4.

[Chemical Formula 4]

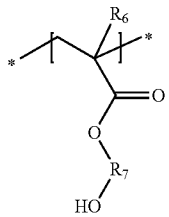

In Chemical Formula 4, $R_6$ may indicate hydrogen, a C1-C6 alkyl group, or a C1-C6 halogenated alkyl group. $R_7$ may represent C1-C5 alkylene. In an embodiment, when $R_7$ is ethylene, the hydrophilic unit may be a hydroxyethyl methacrylate (HEMA) unit, and the second brush polymer may have a PS-r-HEMA structure.

The second brush polymer may be represented by the following Chemical Formula 5.

[Chemical Formula 5]

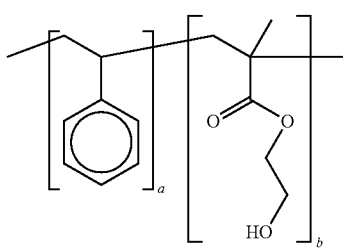

In Chemical Formula 5, a left unit and a right unit may represent the hydrophobic unit and the hydrophilic unit, respectively, and "a" and "b" may represent molar ratios of the hydrophobic unit and the hydrophilic unit, respectively. The molar ratio of the hydrophilic unit may be about 0.1 mol % to about 10 mol %. If the molar ratio of the hydrophilic unit is less than about 0.1 mol %, the second brush polymer may not be reacted sufficiently with the guide pattern 145. If the molar ratio of the hydrophilic unit exceeds about 10 mol %, a hydrophobic property of the second brush polymer may be deteriorated. The molar ratio of the hydrophilic unit may be in a range of from about 1 mol % to about 6 mol %, and a ratio of "a" and "b" (a:b) may be about 0.99:0:01 to about 0.94:0.06.

A weight average molecular weight of the second brush polymer may be about 1,000 to about 200,000. If the weight average molecular weight of the second brush polymer is less than about 1,000, the brush layer 150 having a uniform thickness may not be obtained. If the weight average molecular weight of the second brush polymer exceeds about 200,000, a thickness of the brush layer 150 may excessively increase.

A reaction temperature at which the second brush polymer may be reacted with the guide pattern 145 and stabilized may be less than that of the first brush polymer. The reaction temperature of the second brush polymer may be, e.g., about 150° C. to about 180° C.

The brush layer 150 may be formed using a blend of the first brush polymer and the second brush polymer. A mixing ratio of the first brush polymer and the second brush polymer may be adjusted between about 1:9 to about 9:1. The mixing ratio of the first brush polymer and the second brush polymer may be adjusted between about 3:7 to about 7:3.

The brush layer 150 may be formed using a brush polymer in which the first brush polymer and the second brush polymer are incorporated in the same chain. For example, the brush polymer may include a PS unit as the hydrophobic unit that may be a main repeating unit, a terminal hydrophilic unit having at least two hydroxyl groups, and a random hydrophilic repeating unit including a hydroxyl group. In an embodiment, the brush polymer may include a diol terminal group or a triol terminal group in a PS backbone, and a hydroxyl-alkyl methacrylate unit may be randomly inserted in between the PS backbone.

The brush polymer composition may be coated on the intermediate layer 120 and the guide patterns 145. A portion of the brush polymer not reacted with surfaces of the guide patterns 145 may be removed (using, e.g., the above-mentioned organic solvent) to form the brush layer 150. The brush layer 150 may have a thickness of about 2 nm to about 20 nm. The non-reacted portion of the brush polymer may be removed using a thinner composition.

Figure 11:
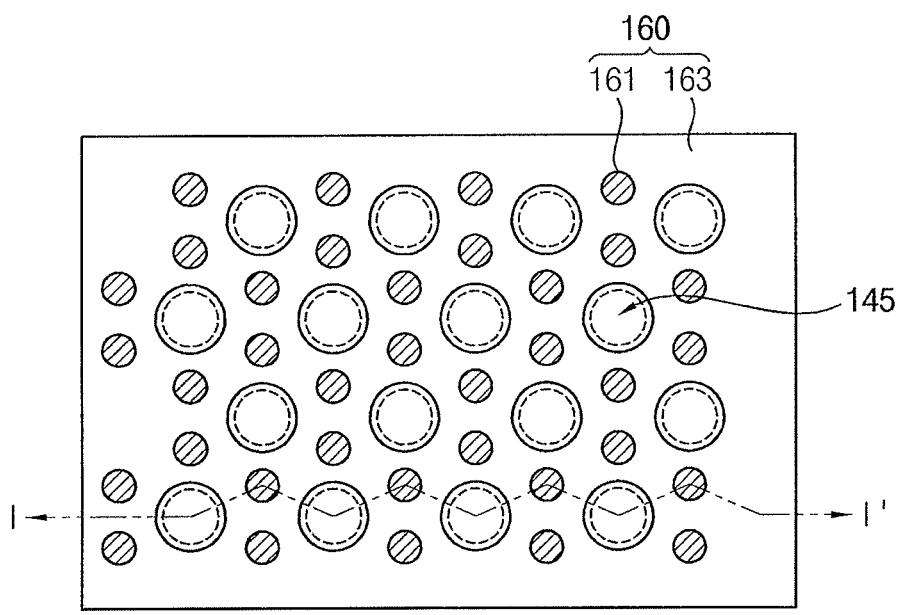
Figure 12:
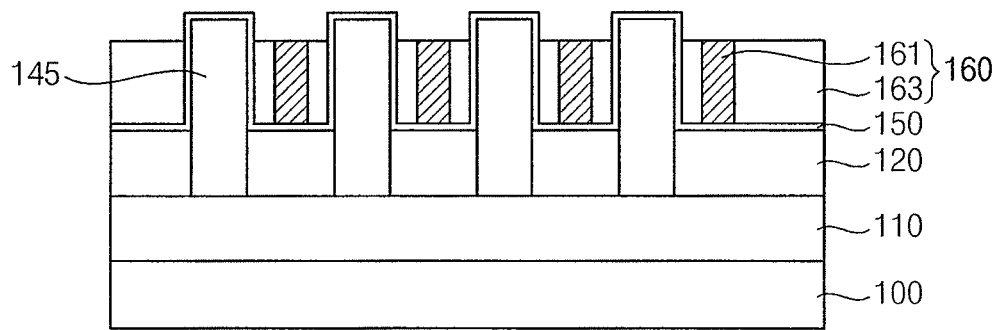

Referring to FIGS. 11 and 12, a self-aligned layer 160 may be formed on the intermediate layer 120 to form blocks 161 and 163 self-aligned or self-assembled by the guide patterns 145 on which the brush layer 150 is formed. The self-aligned layer 160 may be formed using a block copolymer including two polymer units having different chemical properties. The block copolymer may be prepared by, e.g., cationic or anionic polymerization of first and second polymer units. The first polymer unit may be more hydrophilic than the second polymer unit. Examples of the first polymer unit include polymethylmethacrylate (PMMA), polydimethylsiloxane (PDMS), polyvinylpyrrolidone (PVP), polyethyleneoxide (PEO), polylactide (PLA) or polyimide (PI). The second polymer unit may include PS. The block copolymer may be represented as PS-b-PMMA, PS-b-PDMS, PS-b-PVP, PS-b-PEO, PS-b-PLA or PS-b-PI, which may be used alone or in combination. The self-aligned layer 160 may be formed using PS-b-PMMA. The block copolymer may be dissolved in an organic solvent to prepare a composition, which may be coated on the intermediate layer 120 by, e.g., a spin coating or slit coating process to form the self-aligned layer 160.

As illustrated in FIG. 12, the self-aligned layer 160 may partially fill spaces between the guide patterns 145. Accordingly, a top surface of the self-aligned layer 160 may be lower than that of the guide pattern 145. In another implementation, the self-aligned layer 160 may be formed to substantially fully cover the guide patterns 145.

After the coating the composition, a thermal curing process such as an annealing may be further performed. A phase separation of the first polymer unit and the second polymer unit may be induced by the thermal curing process. The first polymer unit and the second polymer unit may be separated from each other due to chemical and/or physical differences caused by the guide pattern 145 and the brush layer 150 to be self-aligned or self-assembled.

The first polymer unit may be assembled to be spaced apart from the guide pattern 145 by the brush layer 150 that may have a hydrophobic outer surface (e.g., by a PS structure). The first polymer unit may be assembled around the guide pattern 145 to form first blocks 161.

The second polymer unit may have an affinity to the brush layer 150, and may be assembled to form second blocks 163. The second block 163 may directly contact a portion of the brush layer 150 which may surround a sidewall of the guide pattern 145, and may also surround sidewalls of the first blocks 161. In example embodiments, a portion of the self-aligned layer except for the first blocks 161 may be defined as the second block 163. The first block 161 and the second block 163 may include, for example, PMMA and PS, respectively.

A plurality of the first blocks 161 may be formed in an arrangement of a grid-type, a mesh-type or a honeycomb-type. In some example embodiments, a plurality of the first blocks 161 may be arranged around one guide pattern 145 to form, e.g., a polygonal unit, and a plurality of the polygonal units may be repeated and expanded.

Referring to FIG. 11, six first blocks 161 may be arranged around the one guide pattern 145 to form a hexagonal unit, and one first block 161 may be formed substantially at a central point of a triangle defined by three guide patterns 145 neighboring each other.

The brush layer 150 may be formed using a brush polymer including at least one of the first brush polymer or the second brush polymer as described above. The brush polymer may have an improved reactivity with the guide patterns 145 by the hydrophilic unit thereof. Thus, an inner lateral surface of the brush layer 150 may be attached to the surface of the guide patterns 145 with a strong reactivity, and an outer surface of the brush layer 150 may be substantially hydrophobic by, e.g., the PS structure. The brush layer 150 may provide chemical and mechanical properties as described above, so that the first blocks 161 including, e.g., PMMA may be uniformly arranged without an alignment failure such as a grid distortion.

Figure 13:
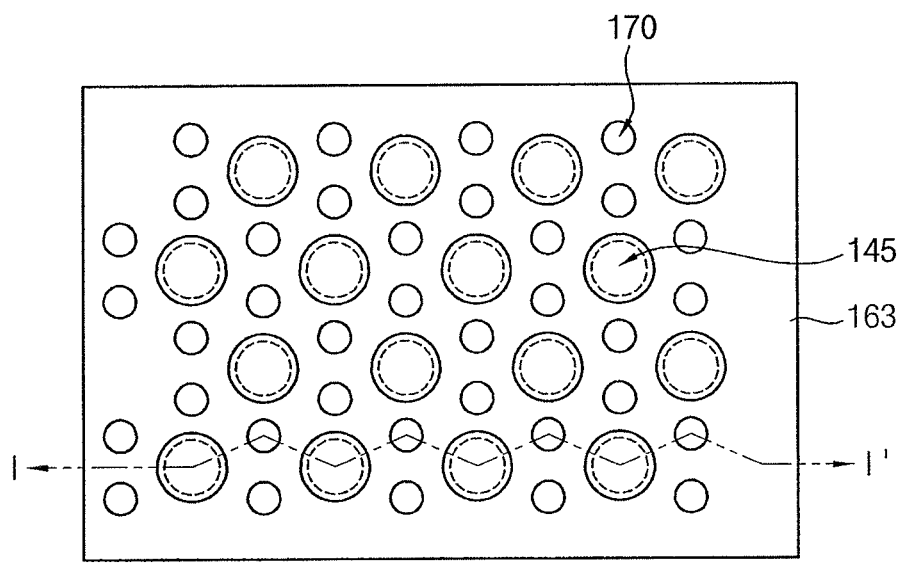
Figure 14:
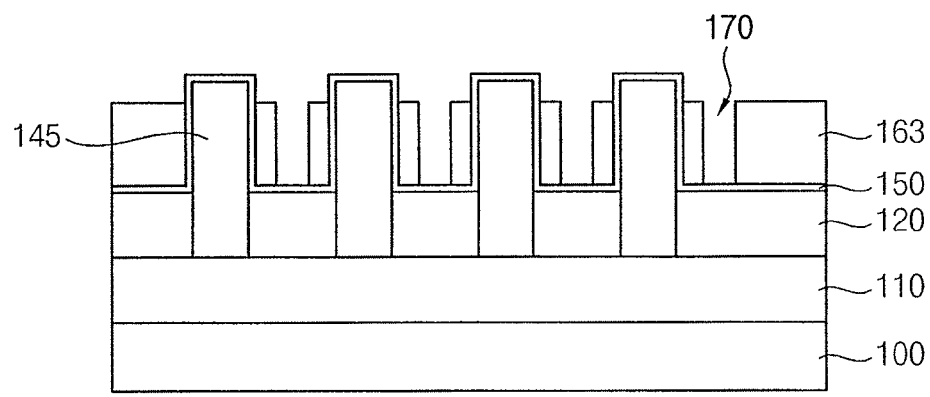

Referring to FIGS. 13 and 14, the first blocks 161 may be selectively removed to form first holes 170. The first blocks 161 may be removed by, e.g., a UV irradiation, a rinse process using a hydrophilic solution such as isopropyl alcohol, a reactive ion etching process, an oxygen plasma etching process, etc. The first holes 170 may be formed at spaces from which the first blocks 161 are removed. A plurality of the first holes 170 may be arranged in a grid-type, a mesh-type or a honeycomb-type having, e.g., repeated hexagonal units according to the arrangement of the first blocks 161.

If the first blocks 161 are not aligned completely, a not-open failure occurring when some hole-formation areas are not opened may be generated. However, as described above, the alignment failure of the first blocks 161 may be avoided due to the brush layer 150, which may be stable mechanically and chemically, and thus the not-open failure may be avoided.

Figure 15:
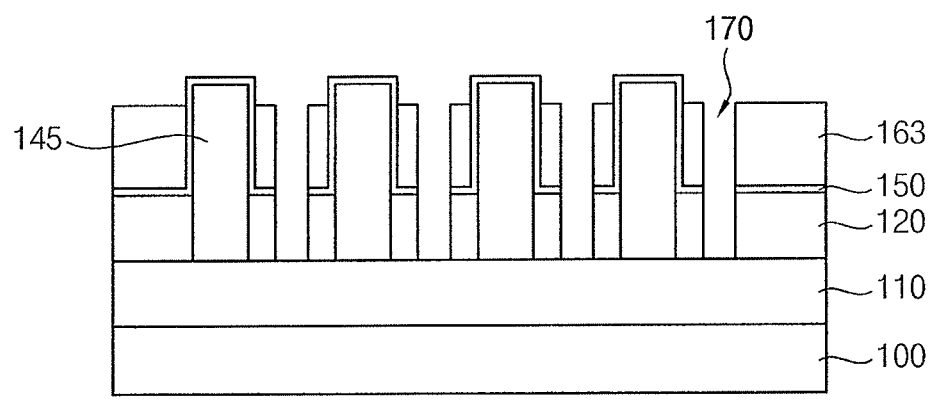

Referring to FIG. 15, the brush layer 150 and the intermediate layer 120 may be partially removed by, e.g., a dry etching process through the first holes 170. Thus, the first holes 170 may be extended into the intermediate layer 120. A top surface of the object layer 110 may be exposed through the extended first holes 170.

Figure 16:
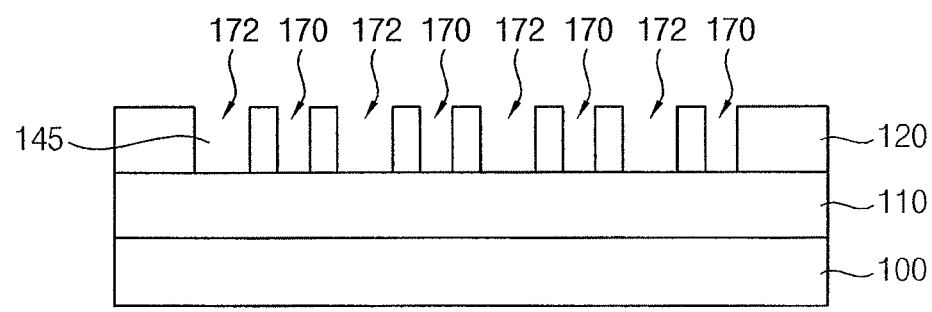

Referring to FIG. 16, the guide patterns 145 may be removed to form second holes 172. The second blocks 163 and the brush layer 150 may be removed by, e.g., an ashing process and/or a strip process to expose the guide patterns 145. The guide patterns 145 may be removed using a solution including, e.g., fluoric acid or a buffer oxide etchant (BOE). Accordingly, the second holes 172 may be additionally formed in the intermediate layer 120 at spaces from which the guide patterns 145 are removed.

Figure 17:
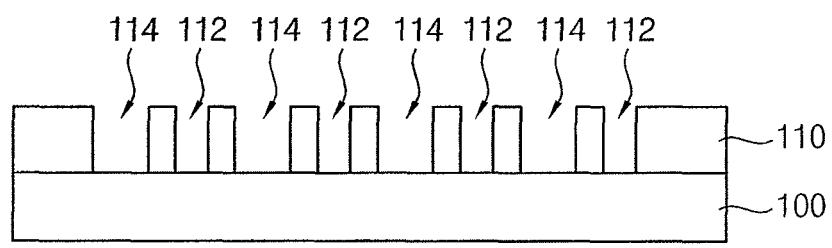

Referring to FIG. 17, the first and second holes 170 and 172 may be transferred to the object layer 110. For example, the intermediate layer 120 (in which the first and second holes 170 and 172 are formed) may be used as an etching mask to partially remove the object layer 110. The first hole 170 and the second hole 172 may be transferred to the object layer 110 to form a first contact hole 112 and a second contact hole 114, respectively, therein. Subsequently, the intermediate layer 120 may be removed by, e.g., a CMP process.

As described above, contact holes having fine pitch and size may be formed at desired positions by the DSA method using the block copolymer.

FIGS. 1 to 17 illustrate that the first blocks may be aligned as pillars in, e.g., a honeycomb arrangement. However, in some embodiments, linear guide patterns may be formed, and a brush layer according to example embodiments as described above may be formed on surfaces of the linear guide patterns. A block copolymer may be coated on the brush layer to form first blocks (e.g., PMMA blocks) and second blocks (e.g., PS blocks) which may extend linearly and may be aligned repeatedly and alternately.

Figure 18:
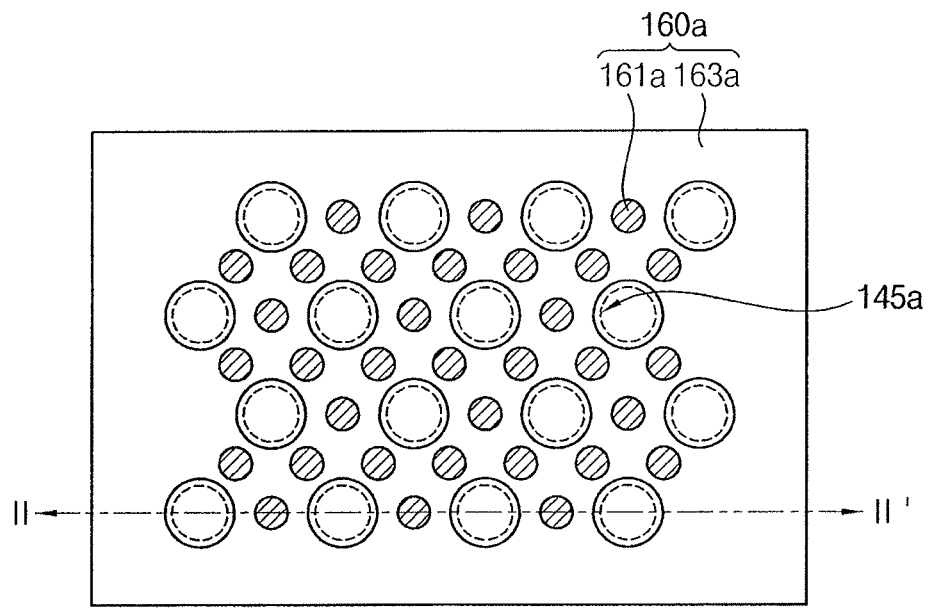
FIGS. 18 to 21 illustrate top plan views and cross-sectional views illustrating a method of forming patterns of a semiconductor device in accordance with example embodiments.
Figure 19:
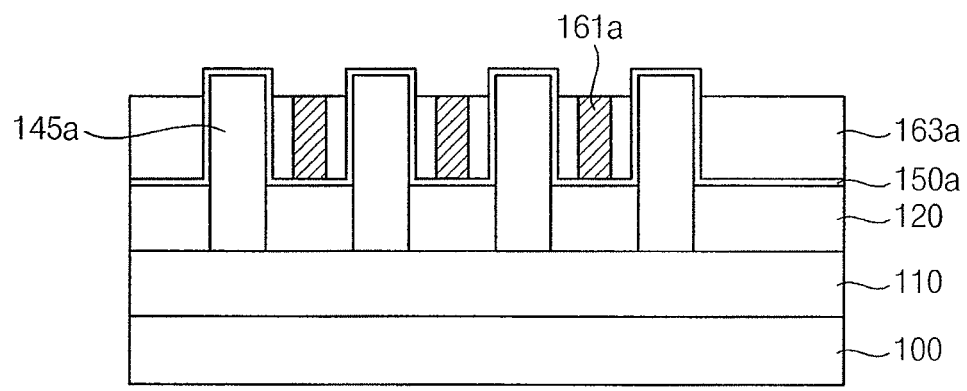
Figure 20:
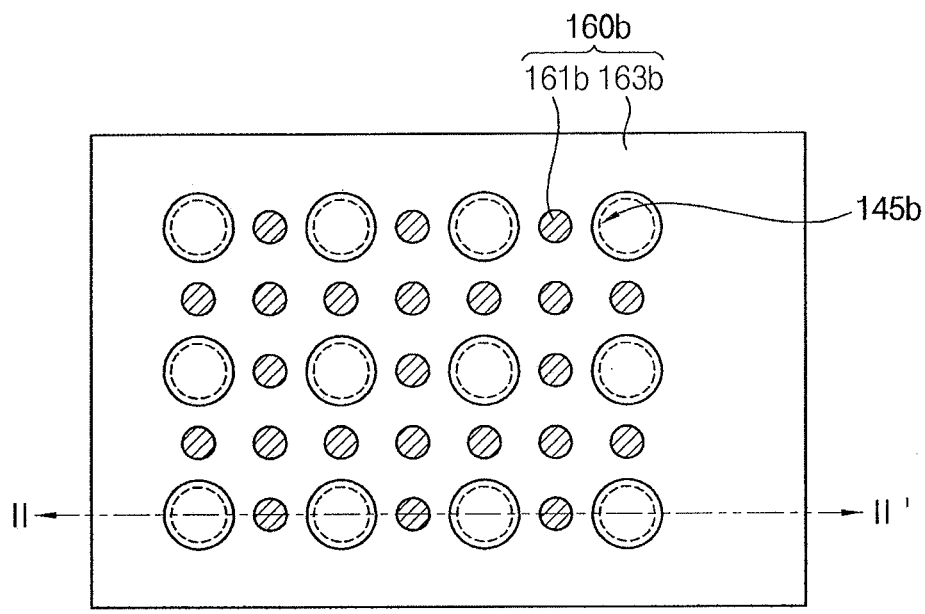
Figure 21:
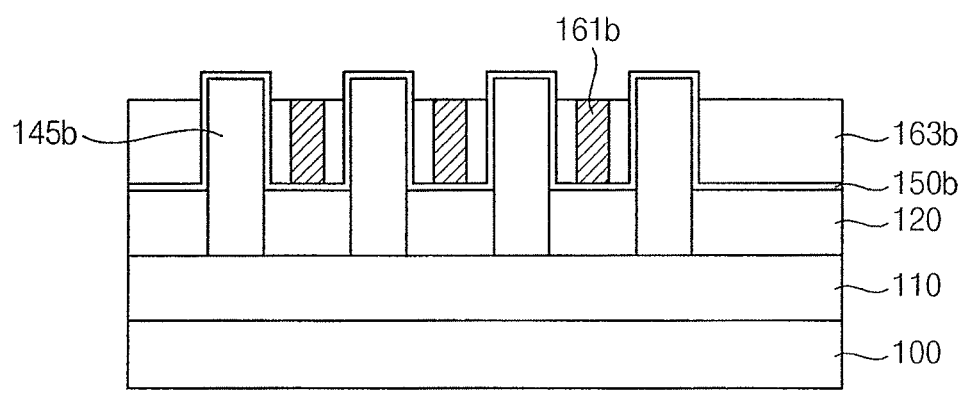

FIGS. 18 to 21 are top plan views and cross-sectional views illustrating a method of forming patterns of a semiconductor device in accordance with example embodiments. FIGS. 18 and 20 are top plan views illustrating the method. FIGS. 19 and 21 are cross-sectional views taken along lines I-I' of FIGS. 18 and 20, respectively. FIGS. 18 to 21 illustrate modifications of an arrangement of first blocks in a self-aligned layer. Thus, detailed descriptions on process and/or materials substantially the same as or similar to those illustrated with reference to FIGS. 1 to 17 are not repeated.

Referring to FIGS. 18 and 19, first blocks 161a included in a self-aligned layer 160a may be arranged substantially at a central point of two guide patterns 145a neighboring each other. In this case, as illustrated in FIG. 18, six first blocks 160a may be arranged around one guide pattern 145a to form a hexagonal unit. Second blocks 163a may be aligned between the guide patterns 145a and the first blocks 161a to contact a brush layer 150a.

Referring to FIGS. 20 and 21, some of first blocks 161b included in a self-aligned layer 160b may be arranged substantially at a central point of two guide patterns 145b neighboring each other. Some of the first blocks 161b may be arranged substantially at a central point of a quadrangle defined by four guide patterns 145b. Thus, eight first blocks 161b may be arranged around one guide pattern 145b. Second blocks 163b may be aligned between the guide patterns 145b and the first blocks 161b to contact a brush layer 150b.

As described with reference to FIGS. 18 to 21, the alignment of the first blocks may be modified in various arrangements, e.g., the guide patterns may be adjusted according to a grid design of target hole areas so that the alignment of the first blocks may be controlled.

Figure 22:
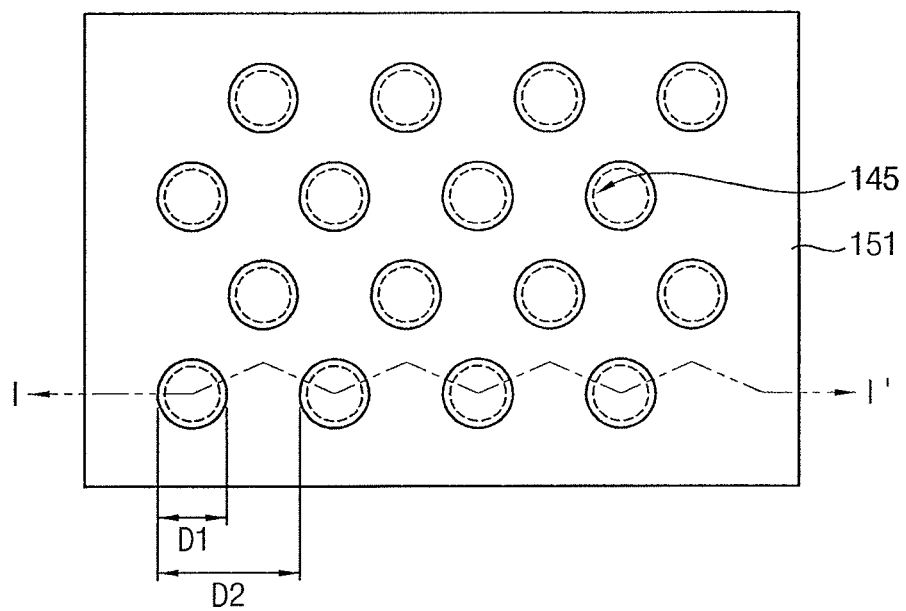
FIGS. 22 to 25 illustrate a top plan view and cross-sectional views illustrating a method of forming patterns of a semiconductor device in accordance with example embodiments.
Figure 23:
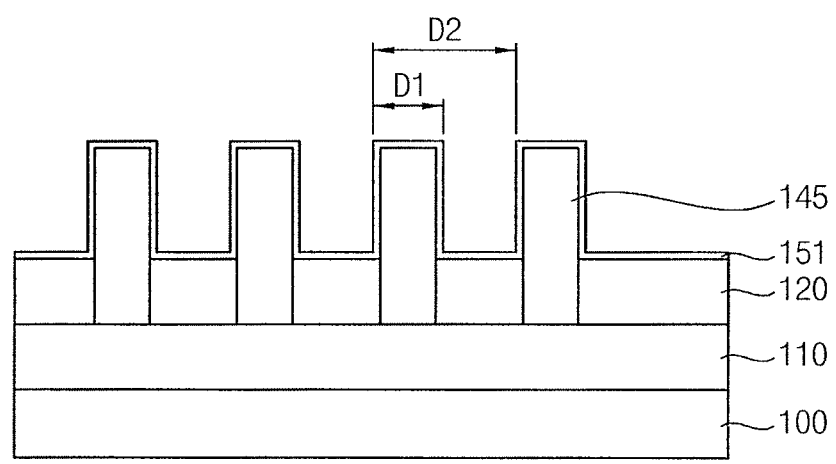
Figure 24:
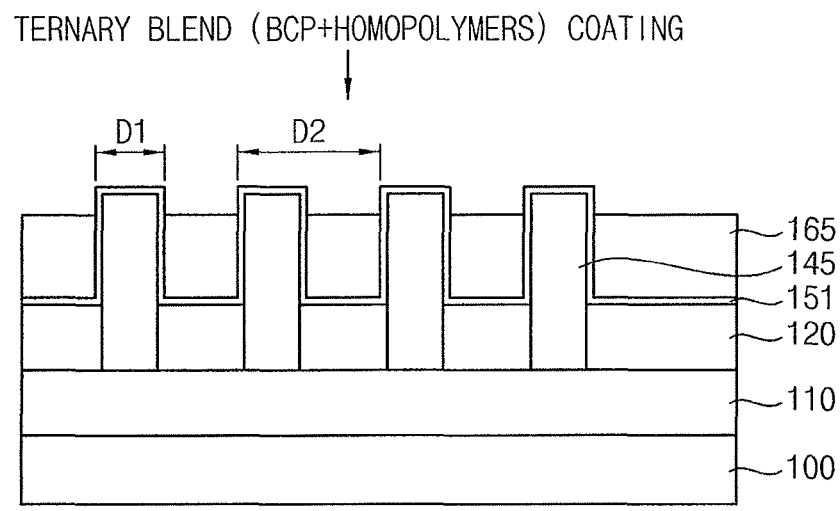
Figure 25:
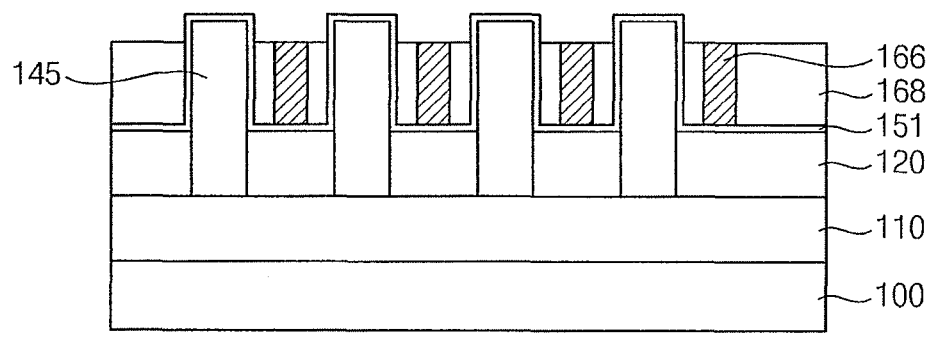

FIGS. 22 to 25 are a top plan view and cross-sectional views illustrating a method of forming patterns of a semiconductor device in accordance with example embodiments. FIG. 22 is a top plan view illustrating the method. FIGS. 23 to 25 are cross-sectional views taken along a line I-I' of FIG. 22. Detailed descriptions on process and/or materials substantially the same as or similar to those illustrated with reference to FIGS. 1 to 17 are not repeated. Referring to FIGS. 22 and 23, processes substantially the same as or similar to those illustrated with reference to FIGS. 1 to 8 may be performed.

An object layer 110 and an intermediate layer 120 may be formed on a substrate 100, and guide patterns 145 protruding from the intermediate layer 120 may be formed. A brush layer 151 may be formed conformally along a top surface of the intermediate layer 120 and exposed surfaces of the guide patterns 145. The brush layer 151 may be formed using, a polymer including PS repeating units. For example, the polymer may include a hydroxyl terminal group, and may have a PS—OH structure. The brush layer 151 may be formed using a random copolymer such as PS-r-PMMA, and may substantially serve as a neutral layer. The brush layer 151 may be formed using the first brush polymer and/or the second brush polymer as described with reference to FIGS. 9 and 10. Thus, the brush layer 151 may be attached to the guide patterns 145 with a stronger reactivity to provide a stable hydrophobicity.

In FIGS. 22 and 23, a diameter of the guide pattern 145 including the brush layer 151 thereon may be designated "D1." A pitch of the guide patterns 145 may be designated "D2."

Referring to FIG. 24, a self-aligned layer 165 including a block copolymer may be formed on the brush layer 151. The self-aligned layer 165 may be formed using a ternary blend that may include the block copolymer and a homopolymer.

As described above, the block copolymer may include a first polymer unit and a second polymer unit. For example, the first polymer unit and the second polymer unit may include PMMA and PS, respectively. The homopolymer may include a first homopolymer that includes the first polymer unit, and a second homopolymer that includes the second polymer unit. For example, the first homopolymer and the second homopolymer may include PMMA and PS, respectively.

The block copolymer may be a lamellar-type block copolymer. The "lamellar-type block copolymer" may refer to a block copolymer in which the first polymer unit and the second polymer unit may be separated as linear patterns by a general DSA method. In the lamellar-type block copolymer, a volume ratio of the first polymer unit (e.g., PMMA) may be about 35% to about 65%, e.g., about 40% to about 60%.

The block copolymer may be a cylinder-type block copolymer. The term "cylinder-type block copolymer" may refer to a block copolymer in which a first polymer unit is separated as pillars by the general DSA method. A ratio of the first polymer unit (e.g., PMMA) of the cylinder-type block copolymer may be less than that of the lamellar-type block copolymer. For example, in the cylinder-type block copolymer, a volume ratio of the first polymer unit may be about 15% to about 65%, or, in some embodiments, about 15% to about 40%.

The diameter D1 of the guide pattern 145 and the pitch D2 of the guide patterns 145 may be controlled within a predetermined range of a unit length of the block copolymer. The unit length of the block copolymer ($L_0$) may indicate a length of a single unit including the second polymer unit-the first polymer unit-the second polymer unit (e.g., PS-PMMA-PS). A ratio of the diameter D1 with respect to the unit length may range from about 0.5 to about 1.5. A ratio of the pitch D2 with respect to the unit length may range from about 1.5 to about 3.

A ratio of the first homopolymer and the second homopolymer may be substantially the same as or similar to a ratio of the first polymer unit and the second polymer unit included in the block copolymer. For example, if a volume ratio of the first polymer unit in the lamellar-type block copolymer is about 45%, a volume ratio of the first homopolymer and the second homopolymer may be adjusted to about 45:55.

The first homopolymer and the second homopolymer may each have a relatively low weight average molecular weight of about 1,000 to about 10,000.

A binary blend may be used instead of the ternary blend. The binary blend may include the above-mentioned block copolymer and an additional block copolymer of a relatively low weight average molecular weight. The additional block copolymer may also include the first polymer unit and the second polymer unit. A weight average molecular weight of each first and second units included in the additional block copolymer may be in a range of about 1,000 to about 10,000. The additional block copolymer may provide an interaction or a function substantially the same or similar to that of the first and second homopolymers.

Referring to FIG. 25, the self-aligned layer 165 may be thermally cured such that the first polymer unit and the second polymer unit are phase-separated. Accordingly, first blocks 166 and a second block 168 including PMMA and PS, respectively, may be formed. The first blocks 166 and the second block 168 may be self-aligned or self-assembled in an arrangement substantially the same as or similar to that illustrated with reference to FIG. 11. For example, if some of the first blocks 166 including PMMA are mis-aligned and a complete hexagonal unit is not formed, the above-mentioned not-open failure may be caused. The lamellar-type block copolymer having a PMMA content greater than that of the cylinder-type block copolymer may help prevent the not-open failure.

The diameter D1 and/or the pitch D2 of the guide pattern 145 may be controlled within a predetermined range of the unit length of the block copolymer. Thus, even though the lamellar-type block copolymer is used, the first blocks 166 having a cylindrical shape or a pillar shape may be obtained.

The first homopolymer and the second homopolymer in the ternary blend may function as an alignment seed of the first polymer unit and the second polymer unit of the lamellar-type block copolymer. The first blocks 166 may be formed in a desired arrangement without a mis-alignment through a combination of an increased amount of PMMA, a size of the guide pattern 145 and/or an interaction with the first and second homopolymers.

The brush layer 150 illustrated with reference to FIGS. 9 and 10 may used as the brush layer 151 to further enhance an aligning reliability of the first blocks 166.

The cylinder-type block copolymer may be used for the formation of the self-aligned layer 165. In this case, the aligning reliability of the first blocks 166 may be enhanced through a combination of the size of the guide pattern 145, the interaction with the first and second homopolymers and/or a function of the brush layer 151.

Subsequently, processes substantially the same as or similar to those illustrated with reference to FIGS. 13 to 17 may be performed. Thus, the first blocks 166 and/or the guide patterns 145 may be transferred to the object layer 110 to form contact holes.

FIGS. 26 to 37 are top plan views and cross-sectional views illustrating a method of forming patterns of a semiconductor device in accordance with some example embodiments. FIGS. 26, 28, 30, 32, 34 and 36 are top plan views illustrating the method. FIGS. 27, 29, 31, 33, 35 and 37 are cross-sectional views taken along lines I-I' indicated in the top plan views. Detailed descriptions on processes and/or materials substantially the same as or similar to those illustrated with reference to FIGS. 1 to 17, or FIGS. 22 to 25 are not repeated herein.

Figure 26:
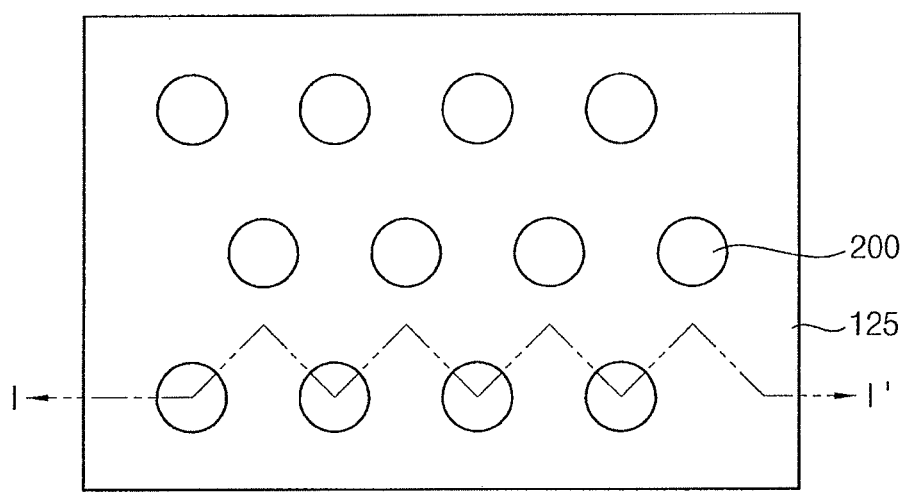
FIGS. 26 to 37 illustrate top plan views and cross-sectional views illustrating a method of forming patterns of a semiconductor device in accordance with example embodiments.
Figure 27:
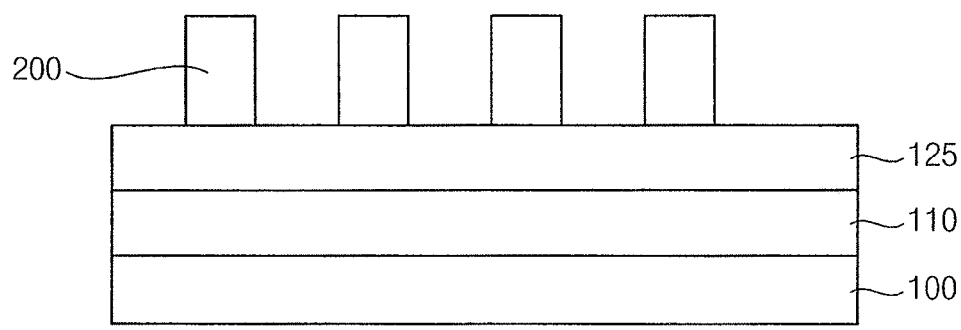

Referring to FIGS. 26 and 27, as also illustrated in FIGS. 1 and 2, an object layer 110 and an intermediate layer 125 may be formed on a substrate 100. Sacrificial patterns 200 may be formed on the intermediate layer 125. The sacrificial patterns 200 may each have a pillar shape or a cylindrical shape, and may be physically separated from each other. The sacrificial patterns 200 may be formed from a photoresist material. A sacrificial layer may be formed using a negative-type photoresist material on the intermediate layer 125. An exposure mask including a plurality of transmitting portions may be placed over the sacrificial layer, and an exposure process may be performed through the transmitting portions. Non-exposed portions of the sacrificial layer may be removed by a developing process to obtain the sacrificial patterns 200. The exposure process may be performed using a light source of an ultraviolet (UV)-ray or an electron beam. The intermediate layer 125 may serve as an anti-reflective layer. The sacrificial patterns 200 may be formed in an arrangement substantially the same as or similar to that of the guiding holes 130a illustrated in FIGS. 1 and 2.

Figure 28:
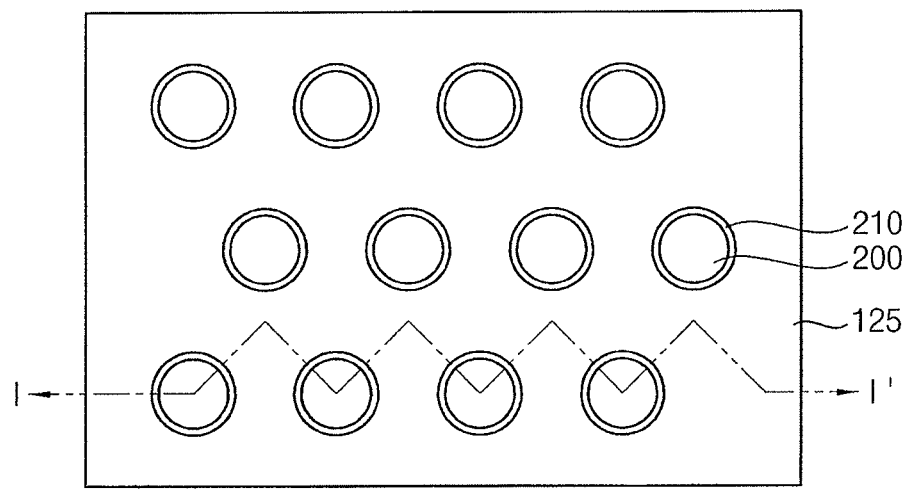
Figure 29:
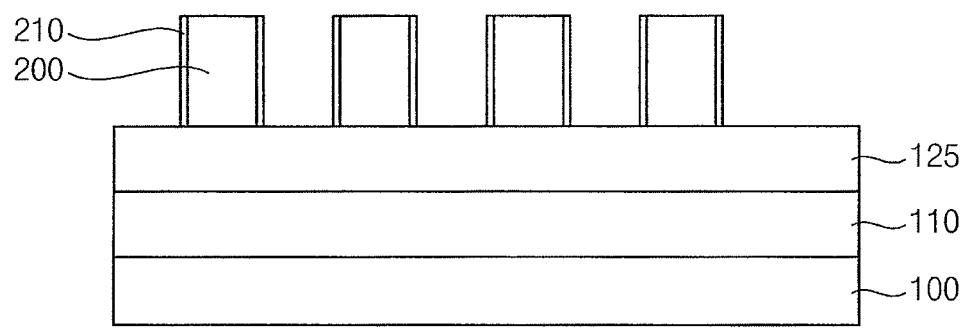

Referring to FIGS. 28 and 29 a guide pattern 210 may be formed on a sidewall of each sacrificial pattern 200. A guide layer may be formed conformally along a top surface of the intermediate layer 125 and surfaces of the sacrificial patterns 200. An upper portion (e.g., a portion formed on top surfaces of the sacrificial patterns 200) and a lower portion (e.g., a portion formed on the top surface of the intermediate layer 125) of the guide layer may be removed by, e.g., an etch-back process. The guide patterns 210 may be formed from portions of the guide layer remaining on the sidewalls of the sacrificial patterns 200. The guide patterns 210 may each have a ring shape surrounding the sidewall of the sacrificial pattern 200, and may be physically separated from each other. The guide layer may be formed using a material having improved step coverage and/or conformal properties, such as an ALD oxide.

Figure 30:
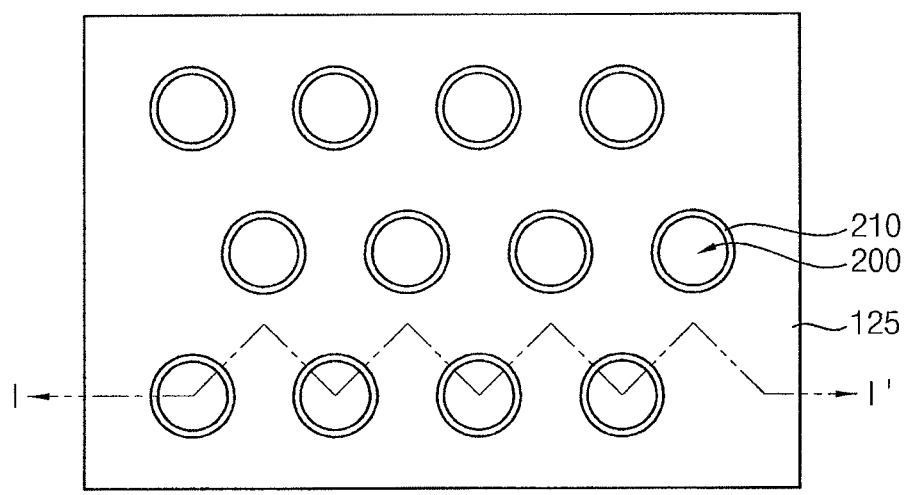
Figure 31:
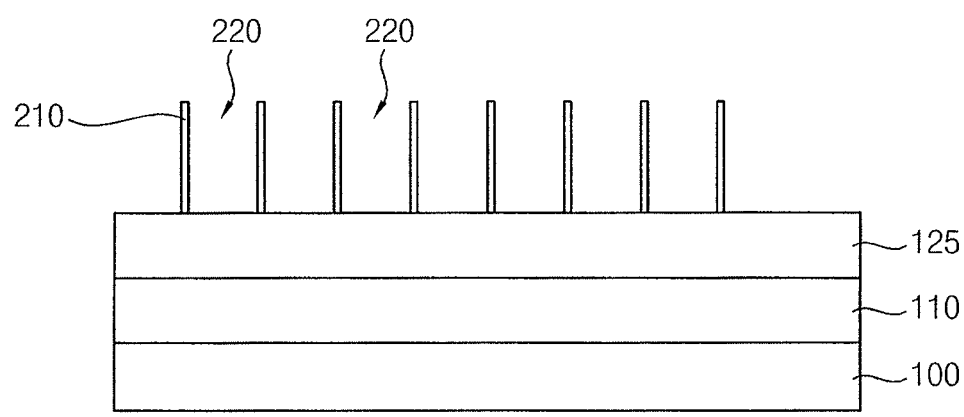

Referring to FIGS. 30 and 31, the sacrificial patterns 200 may be removed, for example, using a thinner composition having solubility for the photoresist material. In an embodiment, the sacrificial patterns 200 may be removed by an ashing process and/or a strip process. Subsequently, the guide patterns 210 (each of which may include a preliminary opening 220) may remain on the intermediate layer 125. The top surface of the intermediate layer 125 may be exposed through the preliminary opening 220.

Figure 32:
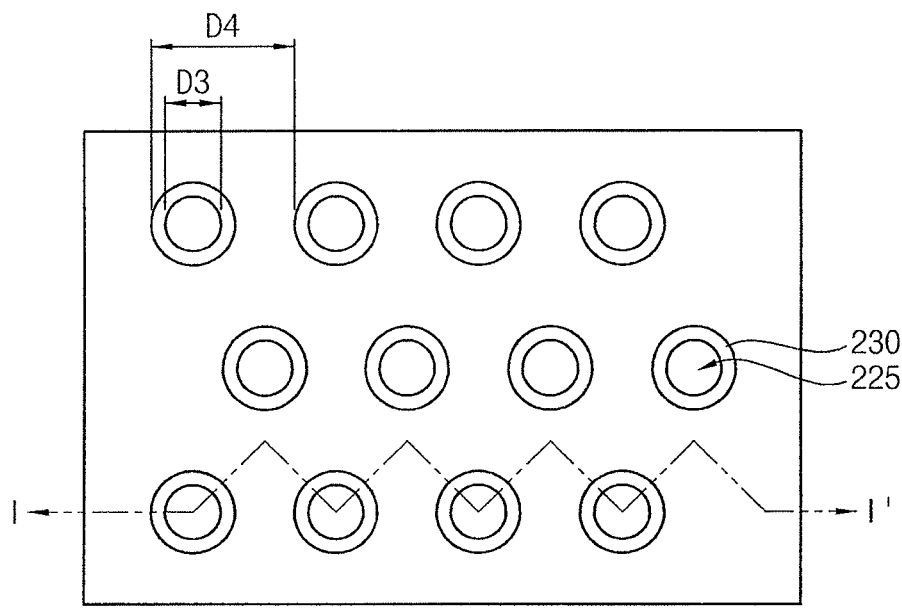
Figure 33:
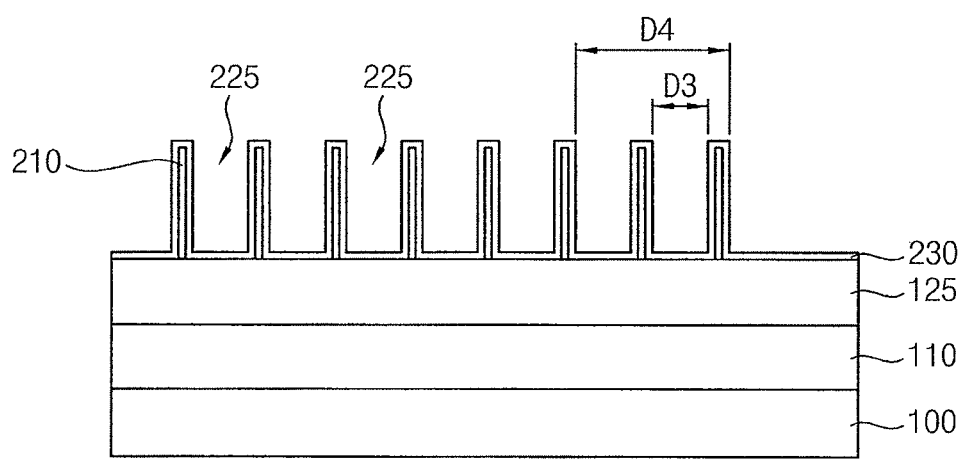

Referring to FIGS. 32 and 33, a brush layer 230 may be formed along the top surface of the intermediate layer 125 and surfaces of the guide patterns 210. The brush layer 230 may be formed using the first brush polymer and/or the second brush polymer as described with reference to FIGS. 9 and 10. Accordingly, the brush layer 230 may be attached to the guide patterns 210 with enhanced reactivity to provide a stable hydrophobicity. The brush layer 230 may be formed using a polymer that may include a PS repeating unit. For example, the polymer may include a hydroxyl terminal group, and may have a PS—OH structure. The brush layer 230 may be formed using a random copolymer such as PS-r-PMMA, and may serve substantially as a neutral layer. After forming the brush layer on the guide pattern 210, an opening 225 having a reduced diameter from the preliminary opening 220 may be defined. As illustrated in FIGS. 32 and 33, the diameter of the opening 225 may be designated "D3," and a pitch of the guide patterns 210 may be designated "D4."

Figure 34:
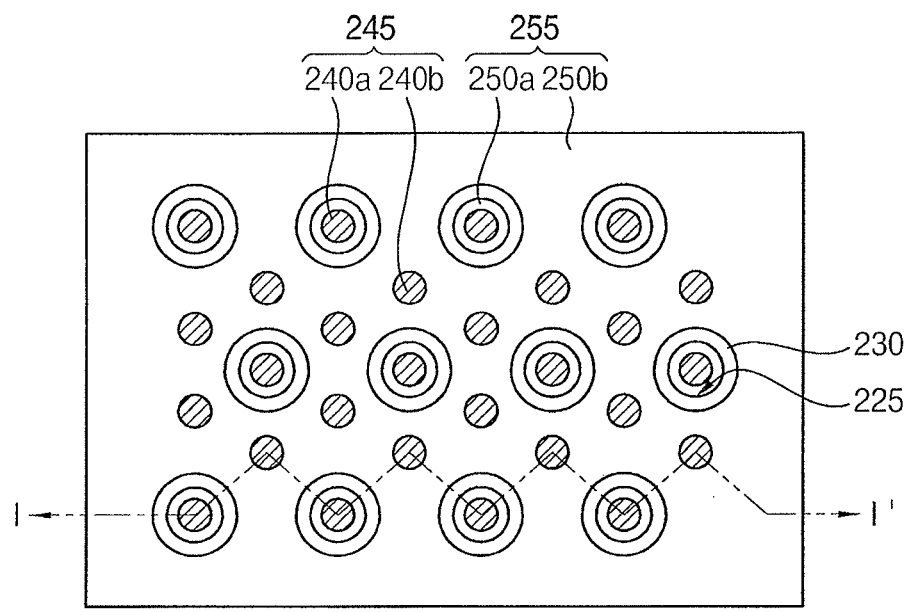
Figure 35:
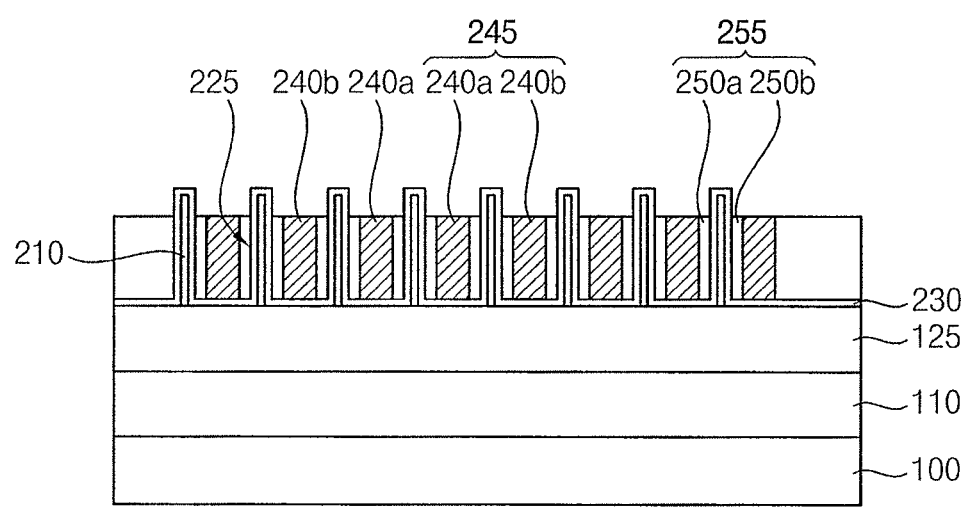

Referring to FIGS. 34 and 35, a self-aligned layer 255 may be formed using a block copolymer such as PS-b-PMMA on the brush layer 230. In example embodiments, a first polymer unit such as PMMA may be self-aligned or self-assembled at a central portion of the opening 225 and around the guide pattern 210 to form first blocks 245. A second polymer unit such as PS may be self-aligned or self-assembled at a peripheral portion of the openings 225 and at an outside of the guide pattern 210 to form second blocks 255. The first blocks 245 may be divided into a first inner block 240a aligned at the central portion of the opening 225, and a first outer block 240b arranged in a honeycomb shape around the guide pattern 210. The second blocks 255 may be divided into a second inner block 250a aligned at the peripheral portion of the opening 225 and surrounding the first inner block 240a, and a second outer block 250b surrounding the first outer blocks 240b at the outside of the guide patterns 210. The second outer block 255 may directly contact a lateral surface of the brush layer 230.

As described above, when the brush layer 230 includes the first brush polymer and/or the second brush polymer as illustrated with reference to FIGS. 9 and 10, the brush layer 230 may have mechanically and chemically stable properties. Thus, the first blocks 245 may be arranged in desired grid or honeycomb shape without generating a mis-alignment.

As also illustrated with reference to FIG. 24, the self-aligned layer 255 may be formed using a ternary blend including a block copolymer and homopolymers. A lamellar-type block copolymer may be used, and the diameter D3 and the pitch D4 of the guide patterns 210 may be controlled to induce the formation of the first blocks 245 having a pillar shape. A ratio of the diameter D3 of the opening 225 with respect to a unit length of the lamellar-type block copolymer may range from about 0.5 to about 1.5. A ratio of the pitch D4 of the guide patterns 210 with respect to the unit length may range from about 1.5 to about 3. A binary blend including the block copolymer and an additional block copolymer of a relatively low weight average molecular weight may be utilized instead of the ternary block copolymer.

Figure 36:
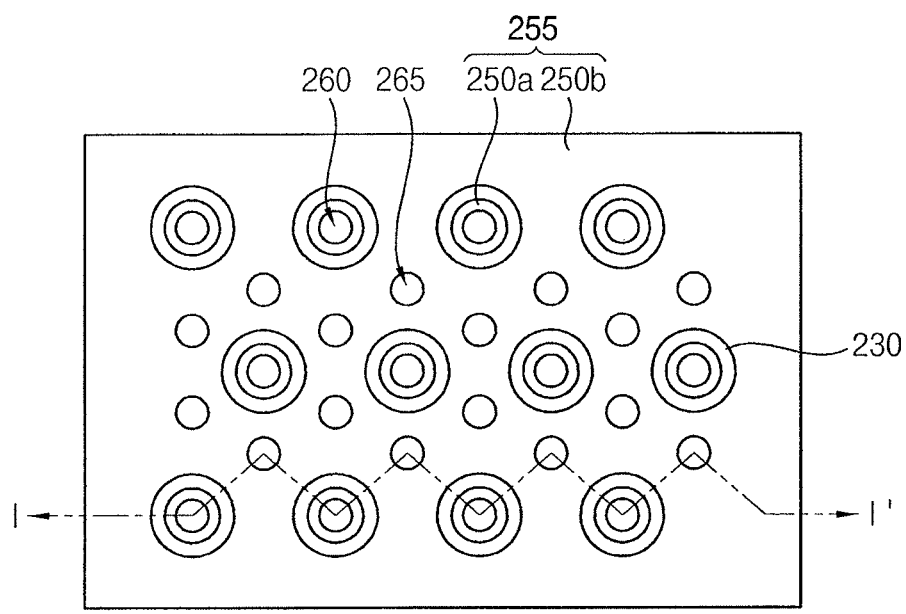
Figure 37:
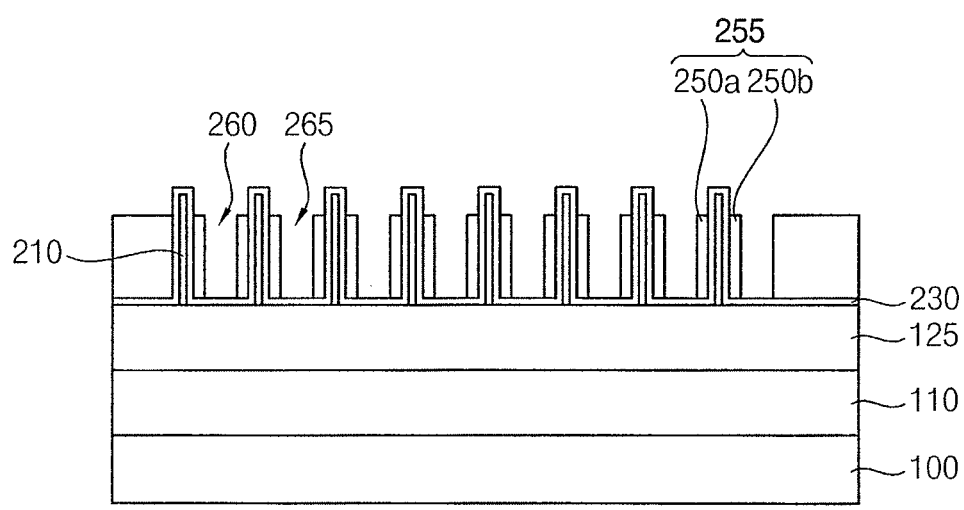

Referring to FIGS. 36 and 37 processes substantially the same as or similar to those illustrated with reference to FIGS. 13 and 14 may be performed to remove the first blocks 245. A first hole 260 may be formed at a space from which the first inner block 240a is removed, and a second hole 265 may be formed at a space from which the first outer block 240b is removed. Subsequently, processes substantially the same as or similar to those illustrated with reference to FIGS. 15 to 17 may be performed. Accordingly, the first and second holes 260 and 265 may be transferred to the object layer 110 to form contact holes.

According to example embodiments as described above, when the guide pattern having the ring shape is used, PMMA blocks may be directed to an inside and an outside of the guide patterns without the mis-alignment by utilizing materials and/or compositions of the brush layer and/or the self-aligned layer according to example embodiments.

Figure 38:
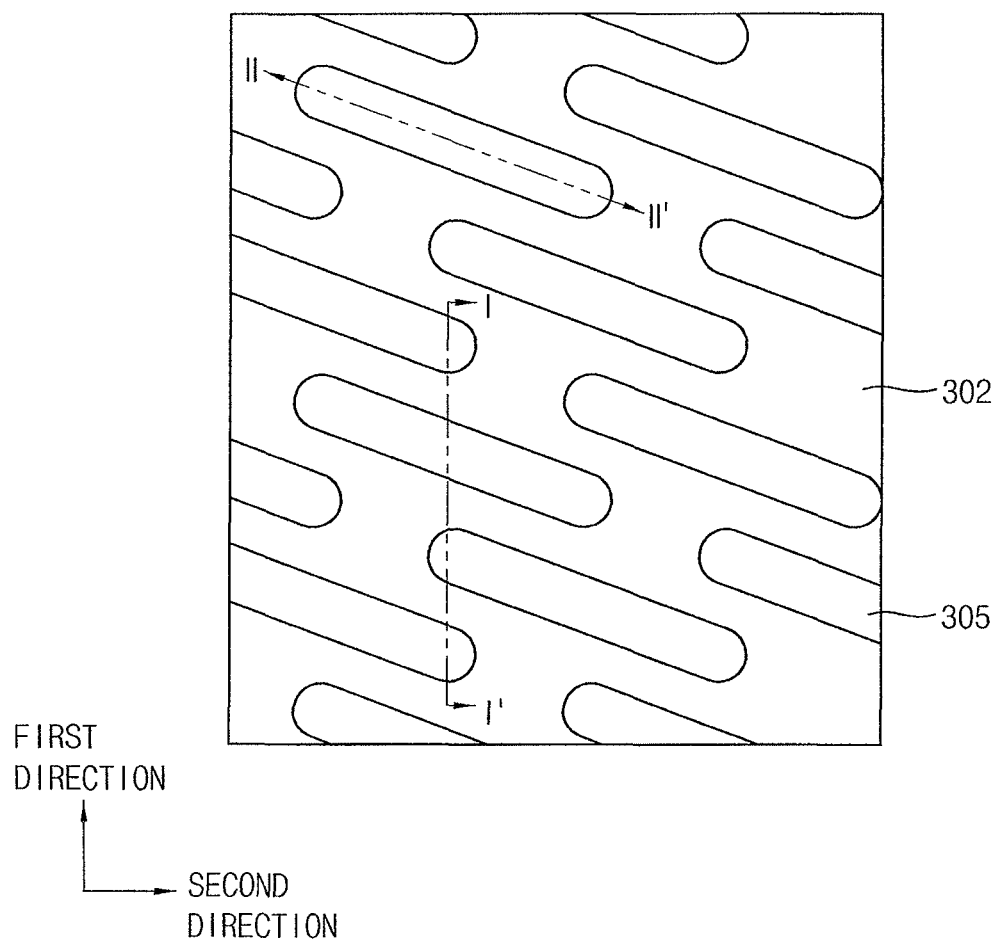
FIGS. 38 to 45 illustrate top plan views and cross-sectional views illustrating a method of manufacturing a semiconductor device in accordance with example embodiments.
Figure 39:
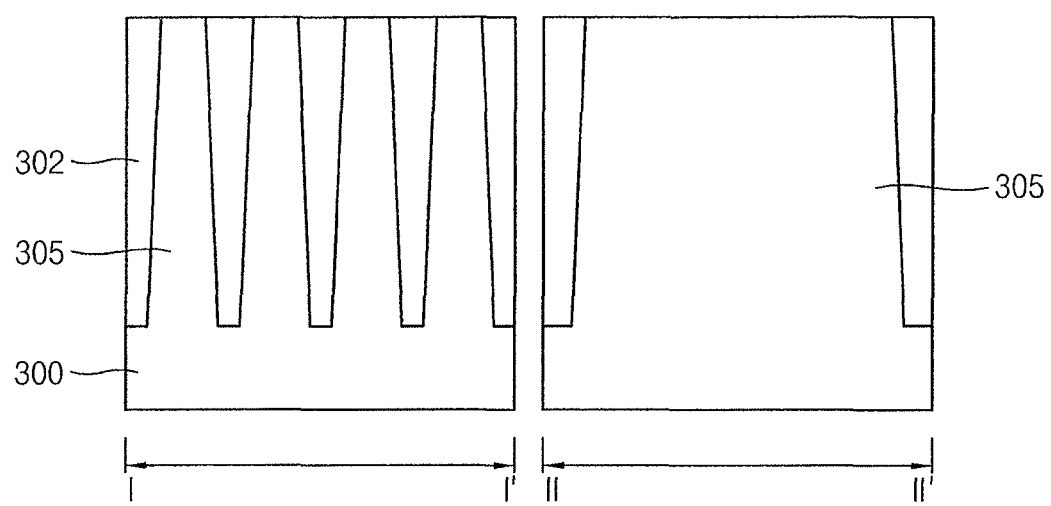
Figure 40:
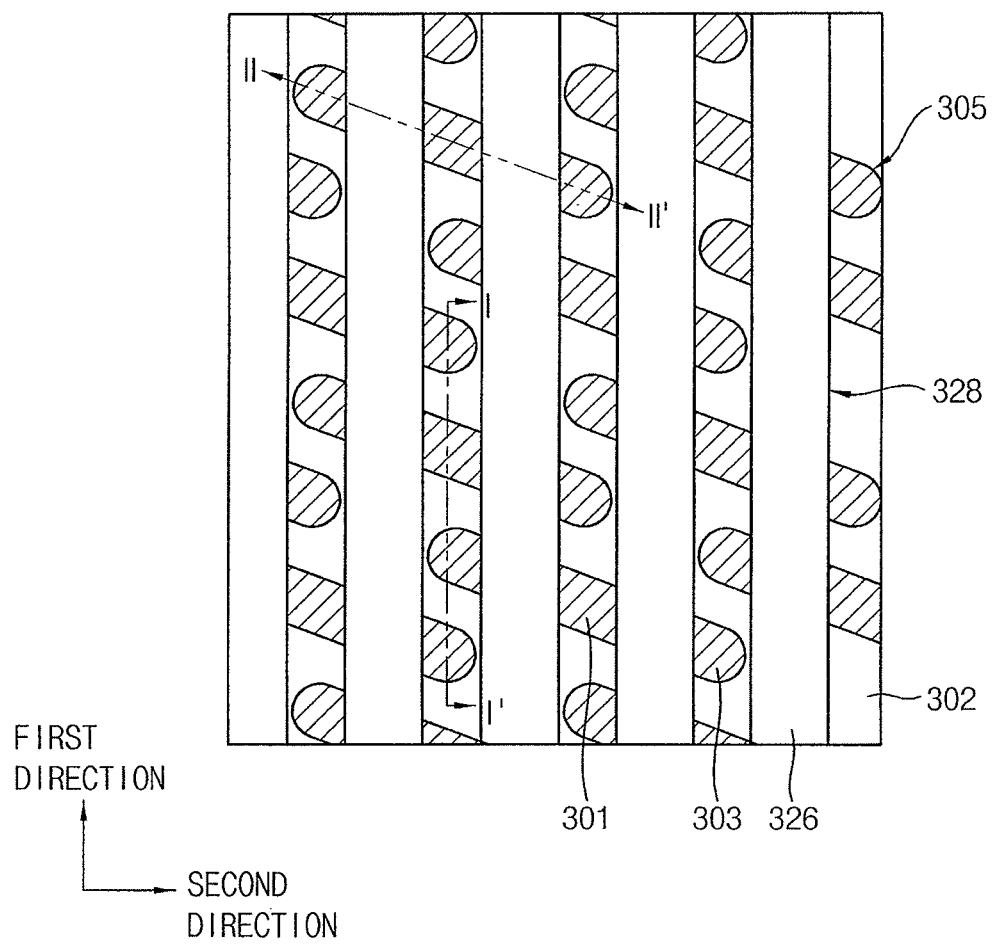
Figure 41:
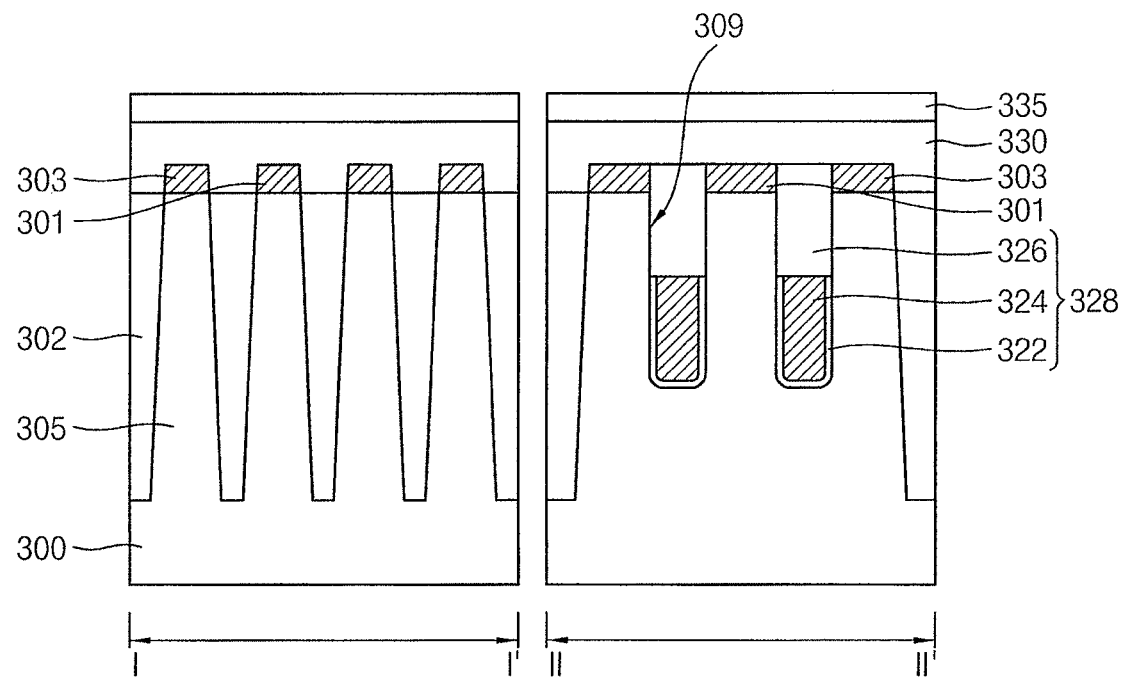
Figure 42:
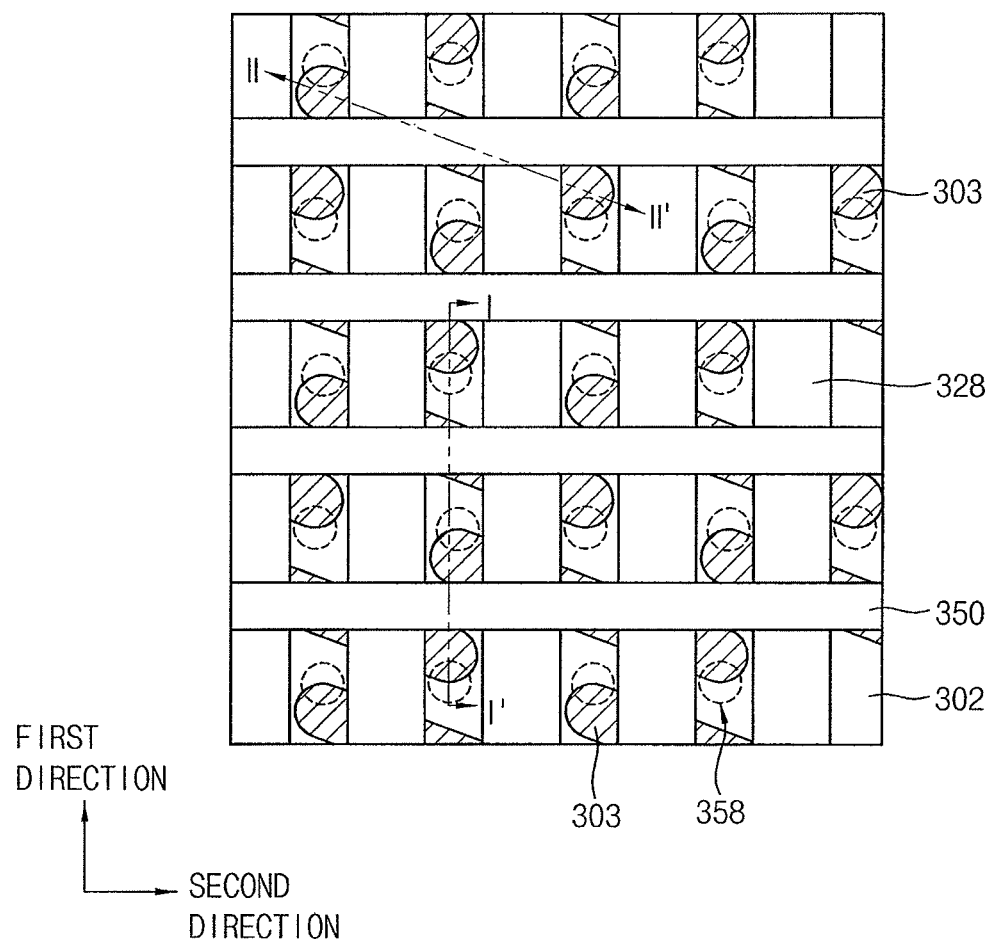

FIGS. 38 to 45 are top plan views and cross-sectional views illustrating a method of manufacturing a semiconductor device in accordance with example embodiments. Specifically, FIGS. 38, 40 and 42 are top plan views illustrating the methods. Each of FIGS. 39, 41, 43, 44 and 45 include sub-cross sectional views taken along lines I-I' and II-II' indicated in FIGS. 38, 40 and 42. Two directions substantially parallel to a top surface of a substrate and perpendicular to each other are defined as a first direction and a second direction throughout FIGS. 38 to 45. For example, FIGS. 38 to 45 illustrate a method of manufacturing a dynamic random access memory (DRAM) device. Detailed descriptions on processes and/or materials substantially the same as or similar to those illustrated with reference to FIGS. 1 to 17, FIGS. 22 to 25, and/or FIGS. 26 to 37 are not repeated herein.

Referring to FIGS. 38 and 39, an isolation layer 302 may be formed on a substrate 300 to define active patterns 305. The isolation layer 302 and the active pattern 305 may be formed by a shallow trench isolation (STI) process. An upper portion of the substrate 300 may be partially removed by an anisotropic etching process to form an isolation trench. An insulation layer filling the isolation trench and including, e.g., silicon oxide, may be formed on the substrate 300. An upper portion of the insulation layer may be planarized by, e.g., a CMP process, until a top surface of the substrate 300 may be exposed to form the isolation layer 302. A plurality of the active patterns 305 may be formed to be spaced apart from each other by the isolation layer 302. As illustrated in FIG. 38, each active pattern 305 may extend in a diagonal direction to the first direction or the second direction by a predetermined angle. The plurality of the active patterns 305 may be arranged in the first and second directions. In some embodiments, before the formation of the isolation layer 302, a liner layer including, e.g., silicon nitride may be further formed along an inner wall of the isolation trench.

Referring to FIGS. 40 and 41, gate structures 328 extending through upper portions of the active patterns 305 and the isolation layer 302 may be formed.

A gate trench 309 extending in the first direction may be formed through the upper portions of the active patterns 305 and the isolation layer 302. A plurality of the gate trenches 309 may be formed along the second direction. In some embodiments, two gate trenches 309 may be formed in one active pattern 305.

A gate insulation layer may be formed on an inner wall of the gate trench 309, and a gate conductive layer filling the gate trenches 309 on the gate insulation layer. Upper portions of the gate conductive layer and the gate insulation layer may be removed by a CMP process and/or an etch-back process, and a gate insulation pattern 322 and a gate electrode 324 filling a lower portion of each gate trench 309 may be formed. The gate insulation layer may be formed of silicon oxide or a metal oxide. The gate conductive layer may be formed of a metal, a metal nitride, a metal silicide, and/or doped polysilicon.

A gate mask layer filling remaining portions of the gate trenches 309 may be formed on the gate insulation pattern 322 and the gate electrode 324. An upper portion of the gate mask layer may be planarized by a CMP process to form a gate mask 326 filling an upper portion of the each gate trench 309. Accordingly, the gate structure 328 including the gate insulation pattern 322, the gate electrode 324, and the gate mask 326 sequentially stacked in the gate trench 309 may be formed. According to an arrangement of the gate trenches 309, the gate structure 328 may extend in the first direction, a plurality of the gate structures 328 may be formed along the second direction. The gate mask layer may be formed of silicon nitride.

As illustrated in FIG. 41, an upper portion of the isolation layer 302 may be partially removed by an etch-back process such that upper portions of the active patterns may be exposed. An ion-implantation process may be performed on the exposed active patterns 305 to form impurity regions 301 and 303. Accordingly, a buried cell array transistor (BCAT) structure including the gate structure 328 and the impurity regions 301 and 303 may be defined. A first impurity region 301 may be formed at a portion of the active pattern 305 between two gate structures 328, and a second impurity region 303 may be formed at a peripheral portion (e.g., at both ends) of the active pattern 305.

A capping layer 330 covering the active patterns 305 and the isolation layer 302 may be formed, and a first insulating interlayer 335 may be formed on the capping layer 330. For example, the capping layer 330 and the first insulating interlayer 335 may be formed of silicon nitride and silicon oxide, respectively. The capping layer 330 may substantially serve as an etch-stop layer during subsequent etching processes.

Figure 43:
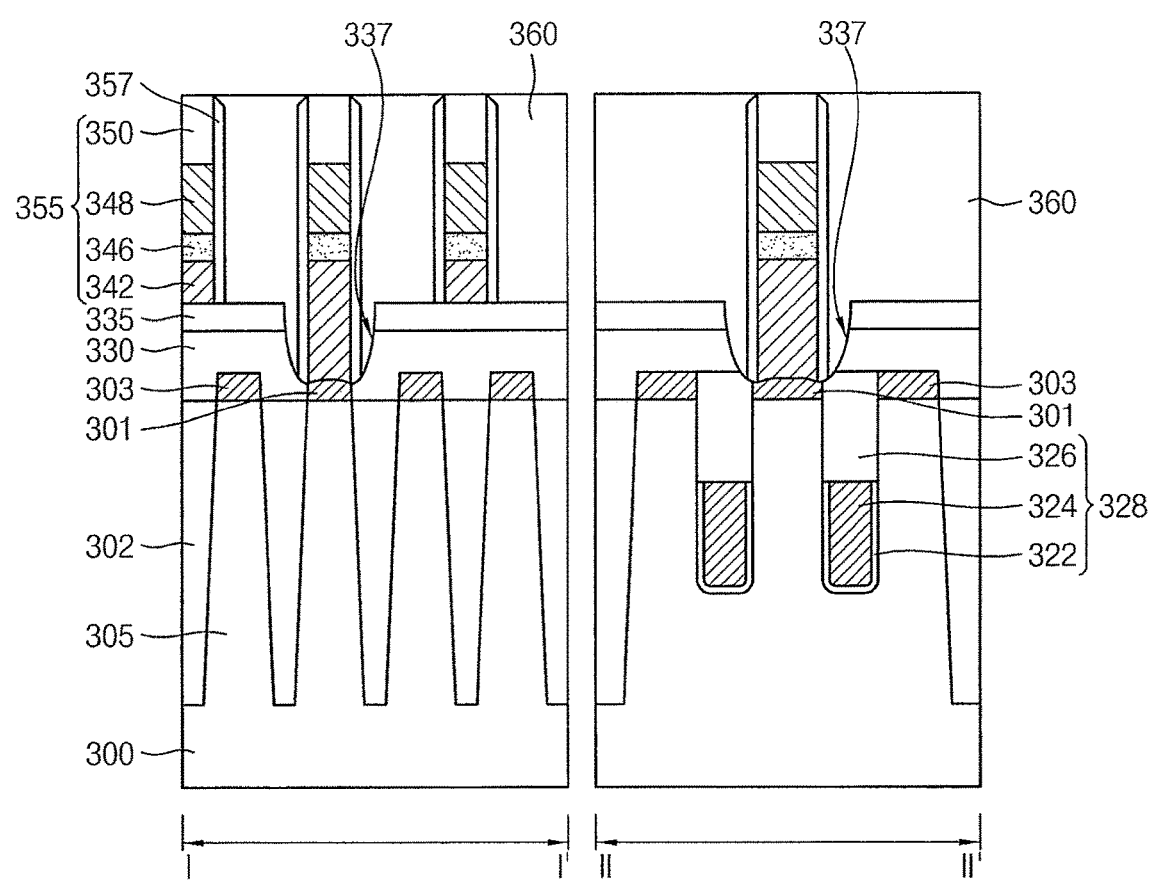

Referring to FIGS. 42 and 43, a conductive line structure 355 extending in the second direction and electrically connected to a plurality of the first impurity regions 301 may be formed. A plurality of the conductive line structures 335 may be formed in the first direction. For example, the first insulating interlayer 335 and the capping layer 330 may be sequentially and partially etched to form a groove 337 through which the first impurity regions 301 may be exposed. The groove 337 may extend in the second direction, and a plurality of the grooves 337 may be formed along the first direction.

A first conductive layer, a barrier conductive layer, and a second conductive layer filling the groove 337 may be formed on the first insulating interlayer 335, and a mask pattern 350 may be formed on the second conductive layer. The first conductive layer may be formed using doped polysilicon, the barrier conductive layer may be formed of a metal nitride or a metal silicide nitride, and the second conductive layer may be formed using a metal. The second conductive layer, the barrier conductive layer, and the first conductive layer may be sequentially etched using the mask pattern 350. Accordingly, a first conductive pattern 342, a barrier conductive pattern 346, and a second conductive pattern 348 may be sequentially formed on the first impurity region 301.

After performing the above-described processes, the conductive line structure 355 including the first conductive pattern 342, the barrier conductive pattern 346, the second conductive pattern 348 and the mask pattern 350 may be formed. The mask pattern 350 may be formed of silicon nitride. The conductive line structure 355 may extend in the second direction on the first impurity region 301. The conductive line structure 355 may serve as a bit line. The conductive line structure 355 may have a narrower width that that of the groove 337.

As illustrated in FIG. 43, a spacer 357 may be formed on the sidewall of the conductive line structure 355. A spacer layer covering the conductive line structure 355 may be formed on the first insulating interlayer 335. The spacer layer may be anisotropically etched to form the spacer 357. The spacer layer may be formed of, e.g., silicon nitride.

A second insulating interlayer 360 covering the conductive line structure 355 may be formed on the first insulating interlayer 335. The second insulating interlayer 360 may fill a remaining portion of the groove 337. An upper portion of the second insulating interlayer 360 may be planarized by a CMP process such that a top surface of the mask pattern 350 may be exposed. The second insulating interlayer 360 may be formed of silicon oxide substantially the same as or similar to that of the first insulating interlayer 335. For convenience, the first insulating interlayer 335 and the capping layer 330 are omitted in FIG. 42.

Figure 44:
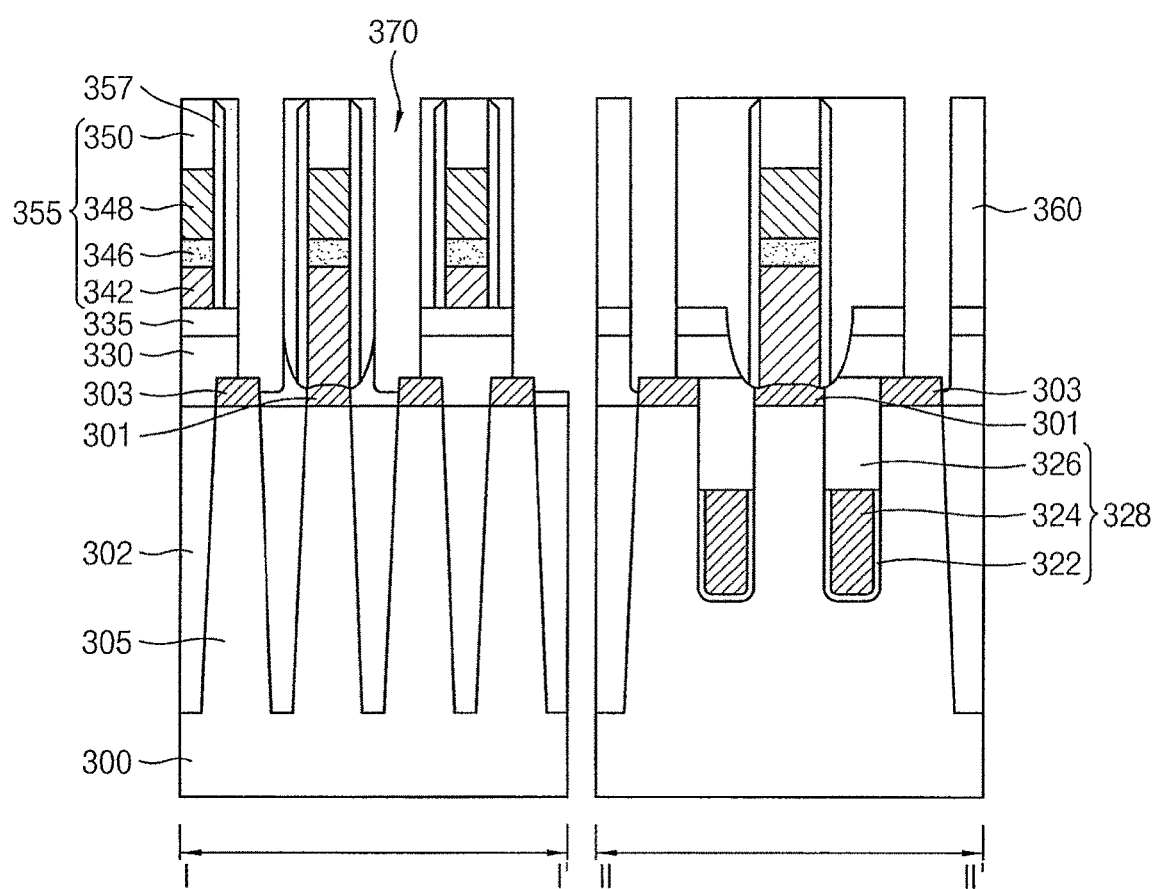

Referring to FIG. 44, the second insulating interlayer 360, the first insulating interlayer 335 and the capping layer 330 may be partially etched to form a contact hole 370 through which the second impurity region 303 may be exposed. The contact hole 370 may be formed per each hole formation area 358 indicated in FIG. 42. The contact holes 370 may be formed using the second insulating interlayer 360 as an object layer by the method of forming patterns illustrated with reference to FIGS. 1 to 17, FIGS. 22 to 25 and/or FIGS. 26 to 37.

An intermediate layer may be formed on the second insulating interlayer 360 and the mask pattern 350. Guide patterns may be formed on the intermediate layer. A brush layer may be formed on surface of the guide patterns, and a self-aligned layer including a block copolymer may be formed. PMMA included in the block copolymer may be assembled into first blocks that may be arranged at areas corresponding to the hole formation areas 358.

The brush layer may be formed using the first brush polymer and/or the second brush polymer illustrated with reference to FIGS. 9 and 10. Accordingly, the brush layer may be attached to the guide patterns with enhanced reactivity to provide a stable hydrophobicity.

The self-aligned layer may be formed using a ternary blend of the block copolymer and homopolymers as illustrated with reference to FIG. 24. A lamellar-type block copolymer may be used as the block copolymer, and a diameter and/or a pitch of the guide patterns may be controlled to induce a formation of the first blocks having a pillar shape. Subsequently, the first blocks may be removed to form holes, and the hole may be transferred to the second insulating interlayer 360 to form the contact holes 370.

Figure 45:
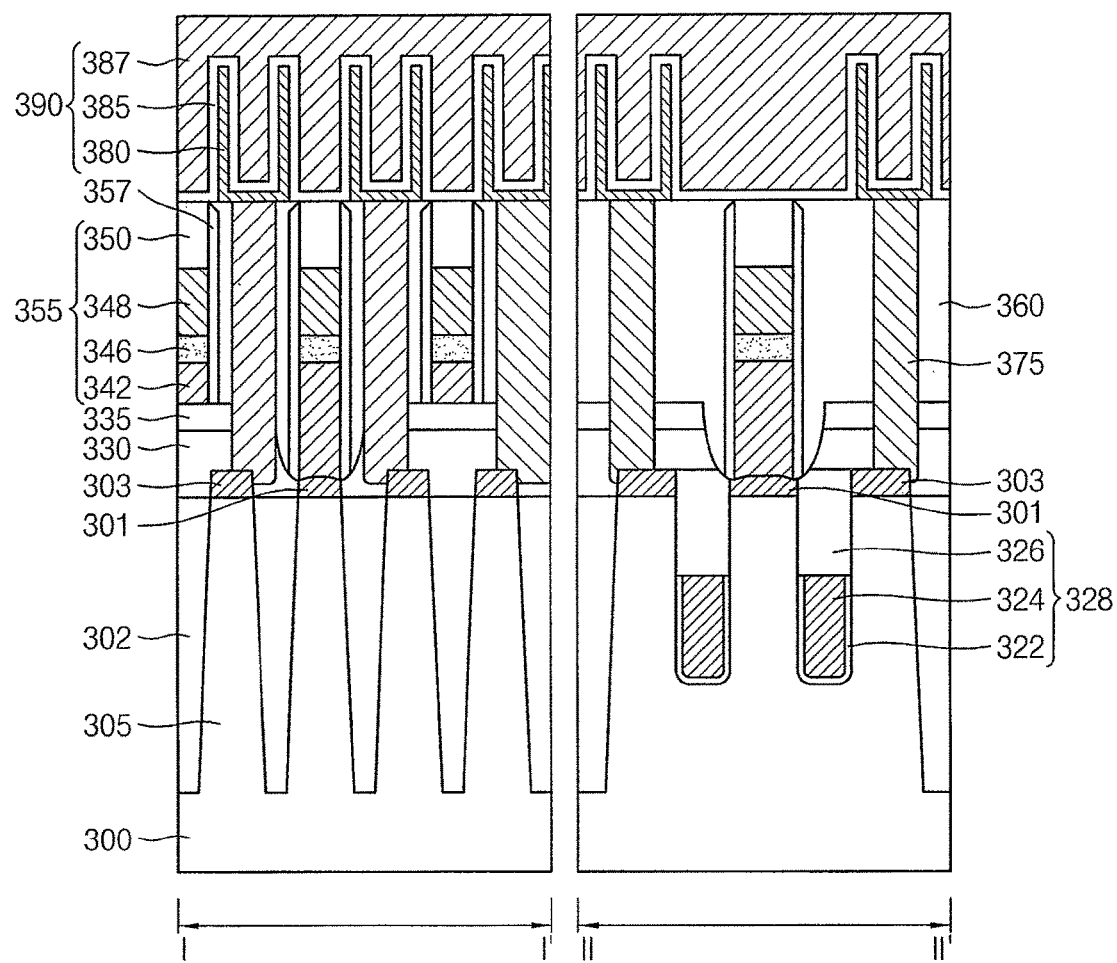

Referring to FIG. 45, a conductive contact 375 may be formed in the contact hole 370. A capacitor 390 may be formed on the conductive contact 375. In this case, the conductive contact 375 may serve as a capacitor contact. The conductive contact 375 may be formed by filling the contact hole 370 with a metal such as copper or tungsten. An etch-stop layer and a mold layer may be formed on the mask pattern 350, the second insulating interlayer 360, and the conductive contact 375. The mold layer and the etch-stop layer may be partially removed to form an opening through which a top surface of the conductive contact 375 is exposed.

A lower electrode layer may be formed along the inner wall of the opening and a top surface of the mold layer. A sacrificial layer (not illustrated) may be formed on the lower electrode layer, and upper portions of the sacrificial layer and the lower electrode layer may be planarized such that the top surface of the mold layer is exposed. The sacrificial layer and the mold layer may be removed to form a lower electrode 380.

A dielectric layer 385 may be formed along surfaces of the etch-stop layer and the lower electrode 380, and an upper electrode 387 may be formed on the dielectric layer 385 to form the capacitor 390. The dielectric layer 385 may be formed of silicon oxide or a metal oxide having a high dielectric constant. The lower and upper electrodes 380 and 387 may be formed of a metal or a metal nitride such as tungsten, tungsten nitride, titanium, titanium nitride, tantalum, tantalum nitride, or ruthenium.

Figure 46:
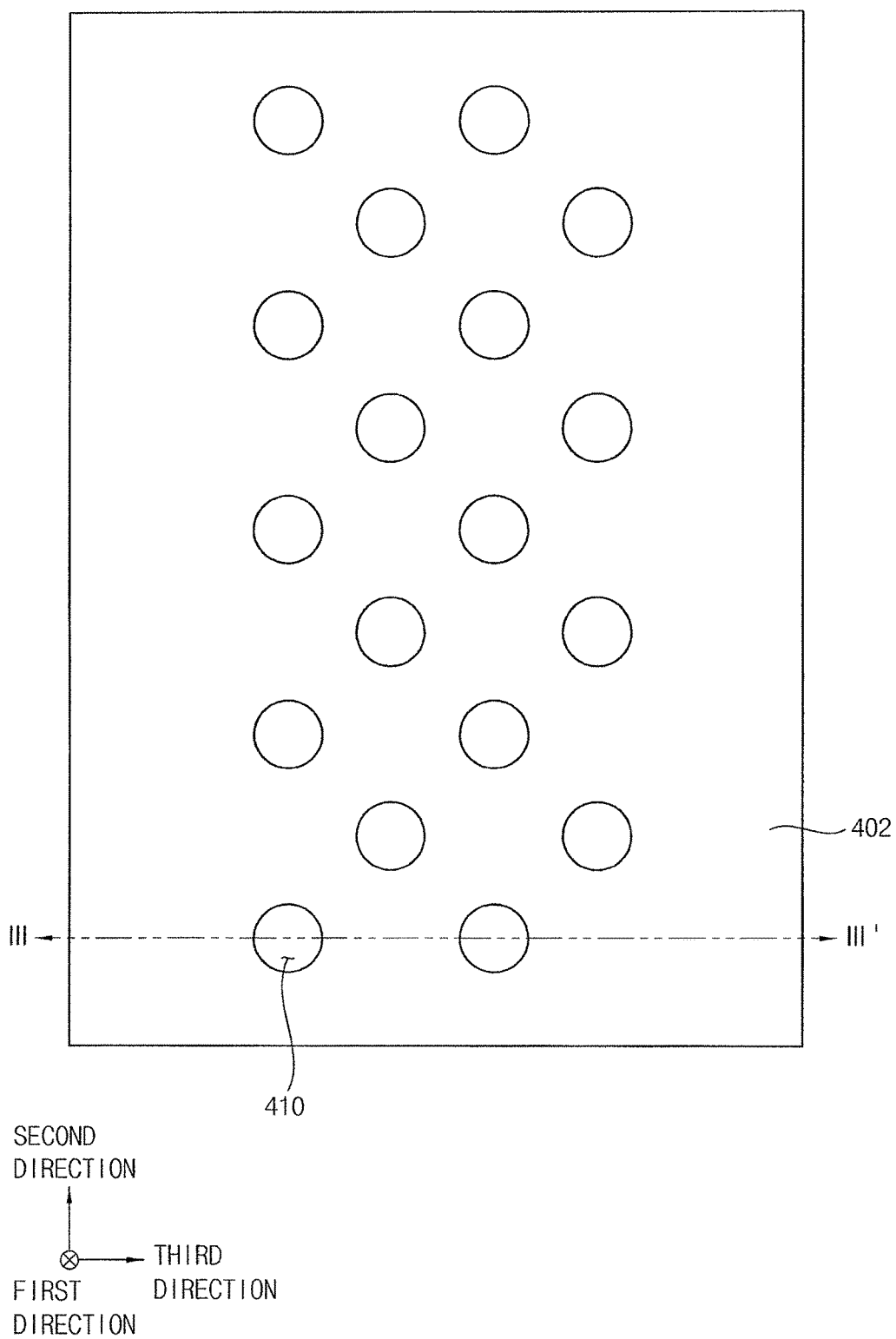
FIGS. 46 to 52 illustrate top plan views and cross-sectional views illustrating a method of manufacturing a semiconductor device in accordance with example embodiments.
Figure 47:
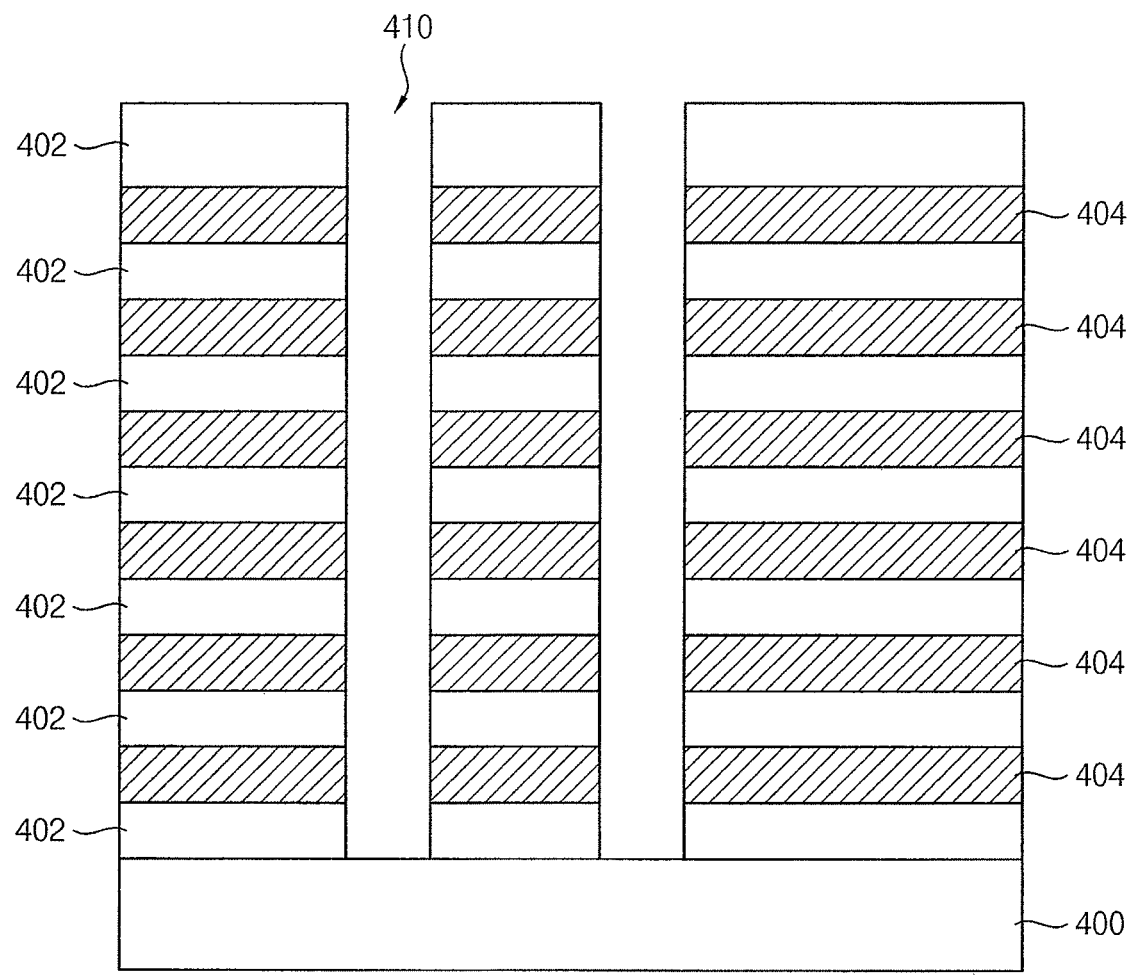
Figure 47:
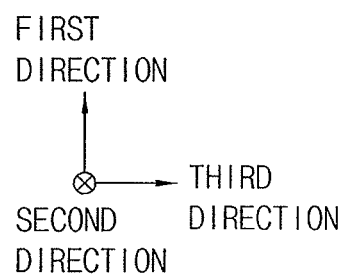
Figure 48:
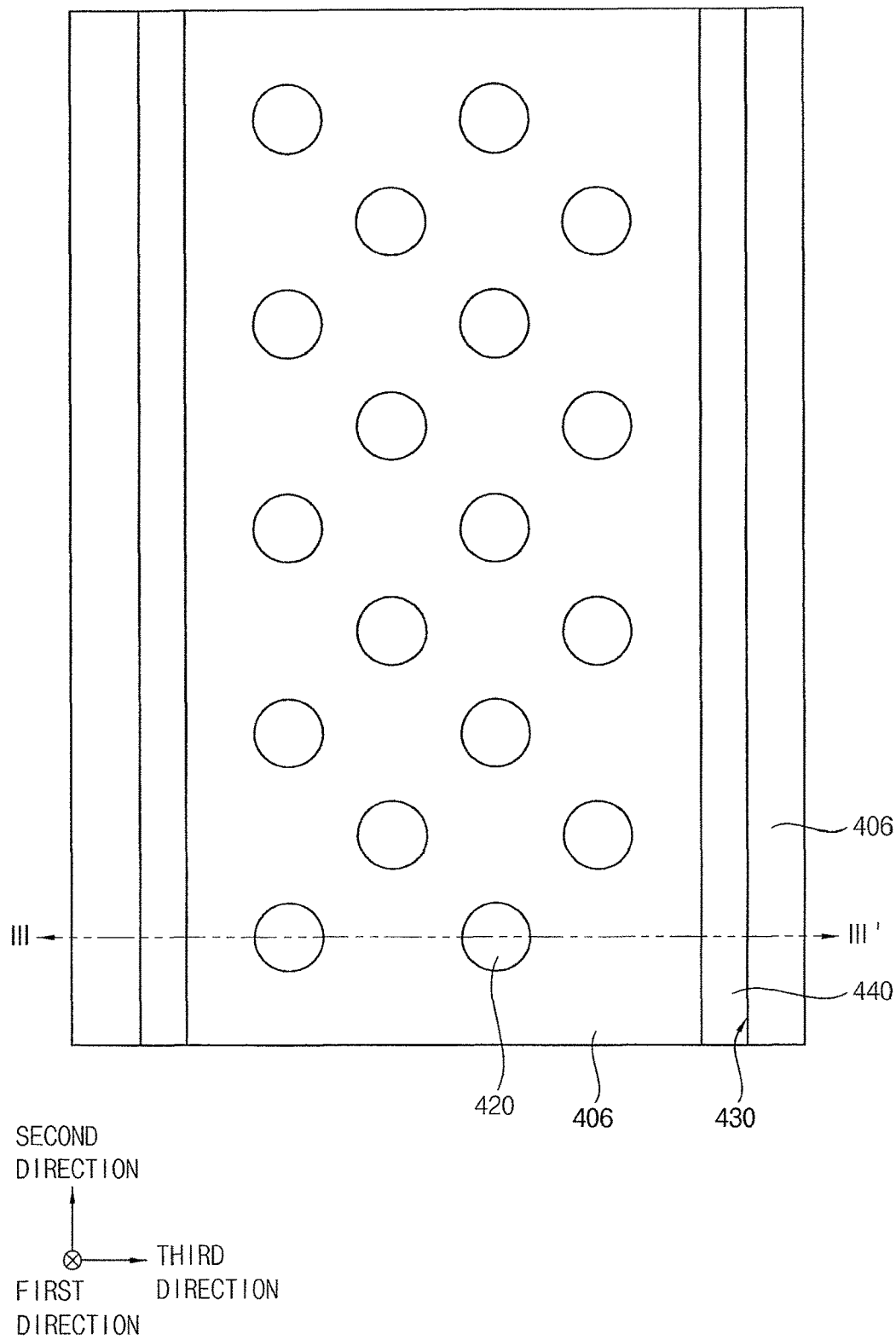
Figure 49:
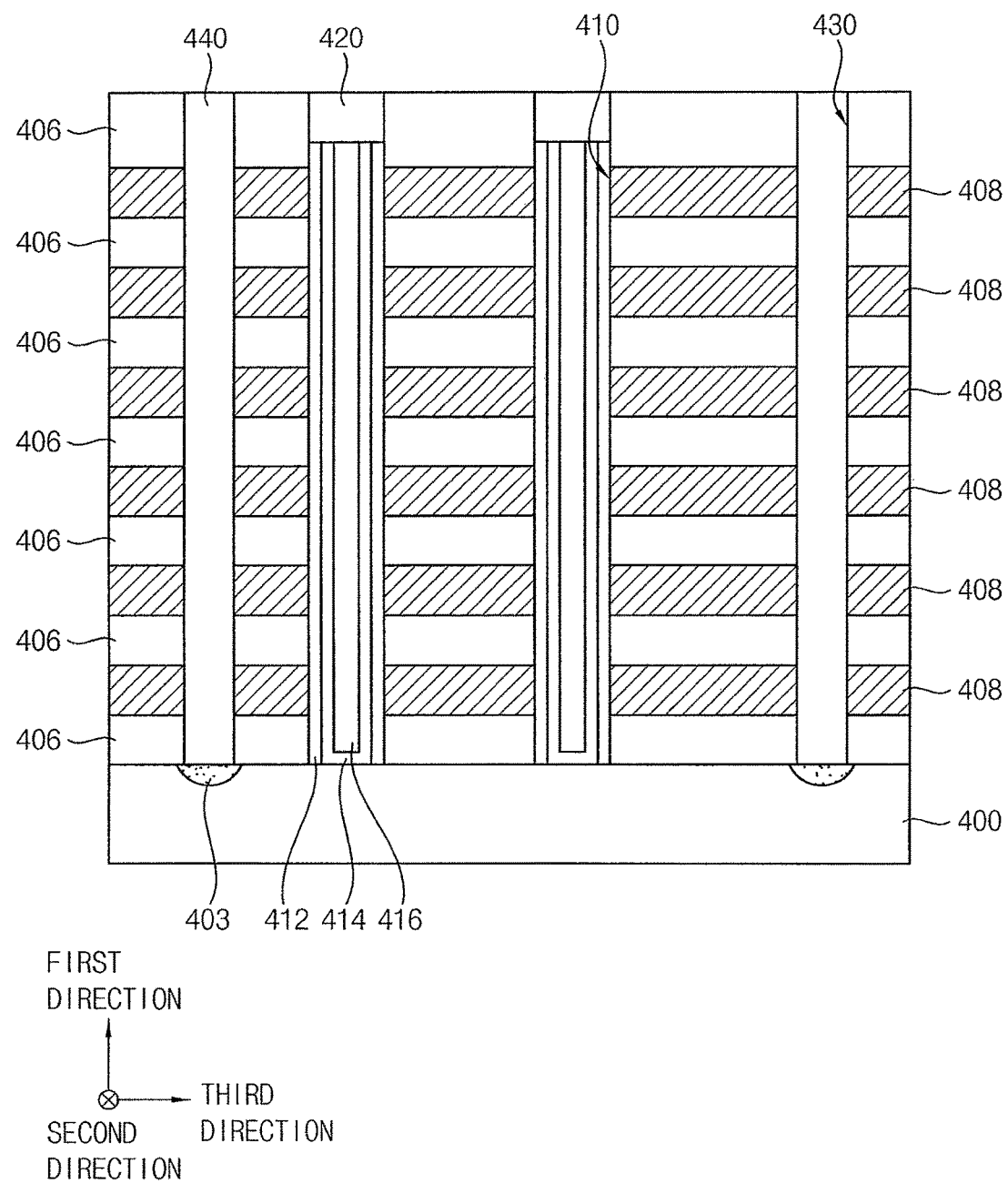
Figure 50:
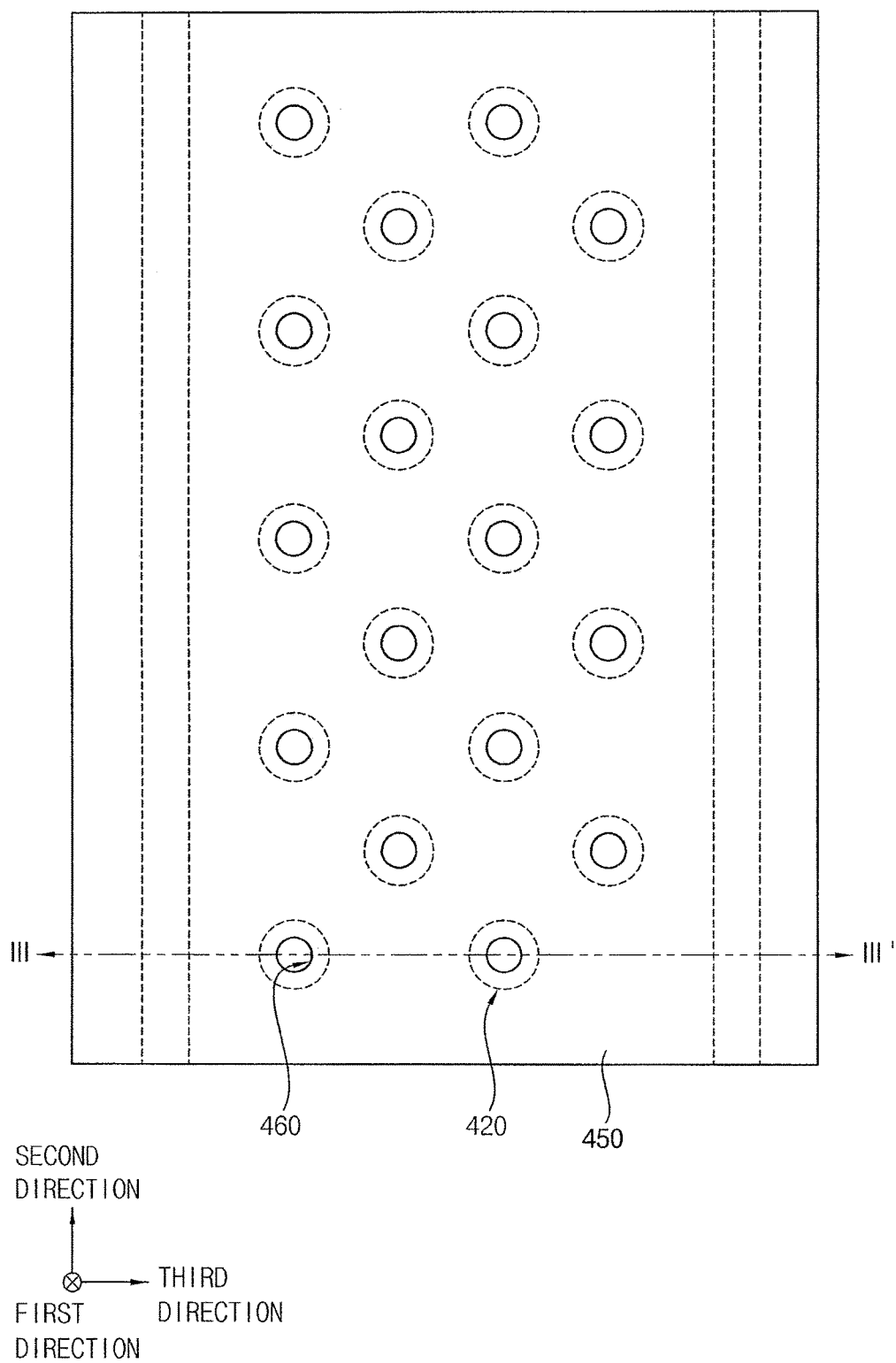

FIGS. 46 to 52 are top plan views and cross-sectional views illustrating a method of manufacturing a semiconductor device in accordance with example embodiments. Specifically, FIGS. 46, 48, and 50 are top plan views illustrating the method. FIGS. 47, 49, 51 and 52 are cross-sectional views taken along lines III-III' indicated in FIGS. 46, 48 and 50.

FIGS. 46 to 52 illustrate a method of manufacturing a vertical memory device including a channel extending vertically with respect to a substrate. Detailed descriptions substantially the same as or similar to those illustrated with reference to FIGS. 1 to 17, FIGS. 22 to 25, and/or FIGS. 26 to 37 are not repeated. In FIGS. 46 to 52, a direction substantially vertical to a top surface of a substrate is referred to as a first direction, and two directions substantially parallel to the top surface of the substrate and crossing each other are referred to as a second direction and a third direction. For example, the second and third directions may be perpendicular to each other. Additionally, a direction indicated by an arrow in the figures and a reverse direction thereof are considered as the same direction.

Referring to FIGS. 46 and 47, a mold structure may be formed on a substrate 400, and a plurality of channel holes 410 may be formed through the mold structure. The channel hole 410 may extend in the first direction, and a top surface of the substrate 400 may be exposed through the channel hole 410. The mold structure may be formed by alternately and repeatedly forming insulating interlayers 402 and sacrificial layers 404. The insulating interlayer 402 and the sacrificial layer 404 may be formed of silicon oxide and silicon nitride, respectively.

The channel holes 410 may be formed using the mold structure as an object layer by the method of forming patterns illustrated with reference to FIGS. 1 to 17, FIGS. 22 to 25 and/or FIGS. 26 to 37. An intermediate layer may be formed on an uppermost insulating interlayer 402, and guide patterns may be formed on the intermediate layer. A brush layer may be formed on surface of the guide patterns, and a self-aligned layer including a block copolymer may be formed. For example, PMMA included in the block copolymer may be assembled into first blocks.

The brush layer may be formed using the first brush polymer and/or the second brush polymer illustrated with reference to FIGS. 9 and 10. Accordingly, the brush layer may be attached to the guide patterns with enhanced reactivity to provide a stable hydrophobicity.

The self-aligned layer may be formed using a ternary blend of the block copolymer and homopolymers as illustrated with reference to FIG. 24. A lamellar-type block copolymer may be used as the block copolymer, and a diameter and/or a pitch of the guide patterns may be controlled to induce a formation of the first blocks having a pillar shape. Subsequently, the first blocks may be removed to form holes, and the holes may be transferred to the mold structure to form the channel holes 410. The guide patterns may be removed to form additional holes, which may be also transferred to form the channel holes 410.

As illustrated in FIG. 46, a plurality of the channel holes 410 may be arranged along the second direction to define a channel hole column, and a plurality of the channel hole columns may be formed along the third direction. The channel holes 410 may be arranged in a grid shape or a honeycomb shape including repeated polygonal units.

Referring to FIGS. 48 and 49, a vertical channel structure may be formed in each channel hole 410. A dielectric layer structure 412 may be formed on a sidewall of the channel hole 410, and a channel 414 may be formed on an inner sidewall of the dielectric layer structure 412 and the top surface of the substrate 400. A filling pattern 416 may be formed on the channel 414 to fill a remaining portion of the channel hole 410. A pad 420 capping an upper portion of the channel hole 410 may be formed on the dielectric layer structure 412, the channel 414 and the filling pattern 416.

The dielectric layer structure 412 may have a substantially straw shape. The dielectric layer structure 412 may include a blocking layer, a charge storage layer and a tunnel insulation layer sequentially formed from the sidewall of the channel hole 410. For example, the dielectric layer structure 412 may be formed as an oxide-nitride-oxide (ONO) layered structure. The channel 414 may have a substantially cup shape, and may be formed of polysilicon. The filling pattern 416 may be formed of an insulation material, e.g., silicon oxide. Upper portions of the dielectric layer structure 412, the channel 414, and the filling pattern 416 may be partially removed to form a recess. A polysilicon layer doped with, e.g., n-type impurities may be formed in the recess to form the pad 420.

As described above, the vertical channel structure including the dielectric layer structure 412, the channel 414, the filling pattern 416, and the pad 420 may be formed in the each channel 410. A plurality of the vertical channel structures may be formed along the second direction to form a channel row, and a plurality of the channel rows may be arranged along the third direction.

After the formation of the vertical channel structure, the mold structure may be partially etched to form an opening 430. The opening 430 may extend in the second direction, and a plurality of the openings 430 may be formed along the third direction. The opening 430 may extend through the mold structure in the first direction, and the top surface of the substrate 400 may be partially exposed therethrough. A predetermined number of the channel rows may be included in the openings neighboring in the third direction. As illustrated in FIG. 48, four channel rows may be included in the neighboring openings 430.

After the formation of the openings 430, the insulating interlayers 402 may be changed into insulating interlayer patterns 406, and the sacrificial layers 404 may be changed into sacrificial patterns. The sacrificial patterns exposed by the opening 430 may be removed using an etchant solution that may have an etching selectivity for, e.g., silicon nitride. Gaps may be defined at spaces from which the sacrificial patterns are removed, and gate lines 408 may be formed by filling the gaps with a conductive material.

The gate lines 408 may include a ground selection line (GSL), a word line and a string selection line (SSL) sequentially stacked from the top surface of the substrate 400. The numbers of the GSL, the word line and the SSL may be determined in consideration of a degree of integration, a capacity, a circuit design, etc., of the semiconductor device.

An ion-implantation process may be performed through the opening 430 to form an impurity region 403 at an upper portion of the exposed substrate 400. The impurity region 403 may include, e.g., n-type impurities, and may extend in the second direction. The impurity region 403 may serve as a common source line (CSL) of the semiconductor device.

A cutting insulation pattern 440 filling the opening 430 and including, e.g., silicon oxide may be formed on the impurity region 403. The gate lines 408 may be cut or intersected by the cutting insulation patterns 440 to surround the predetermined number of the channel rows. The gate lines 408 may be insulated from each other along the first direction by the insulating interlayer patterns 406.

Figure 51:
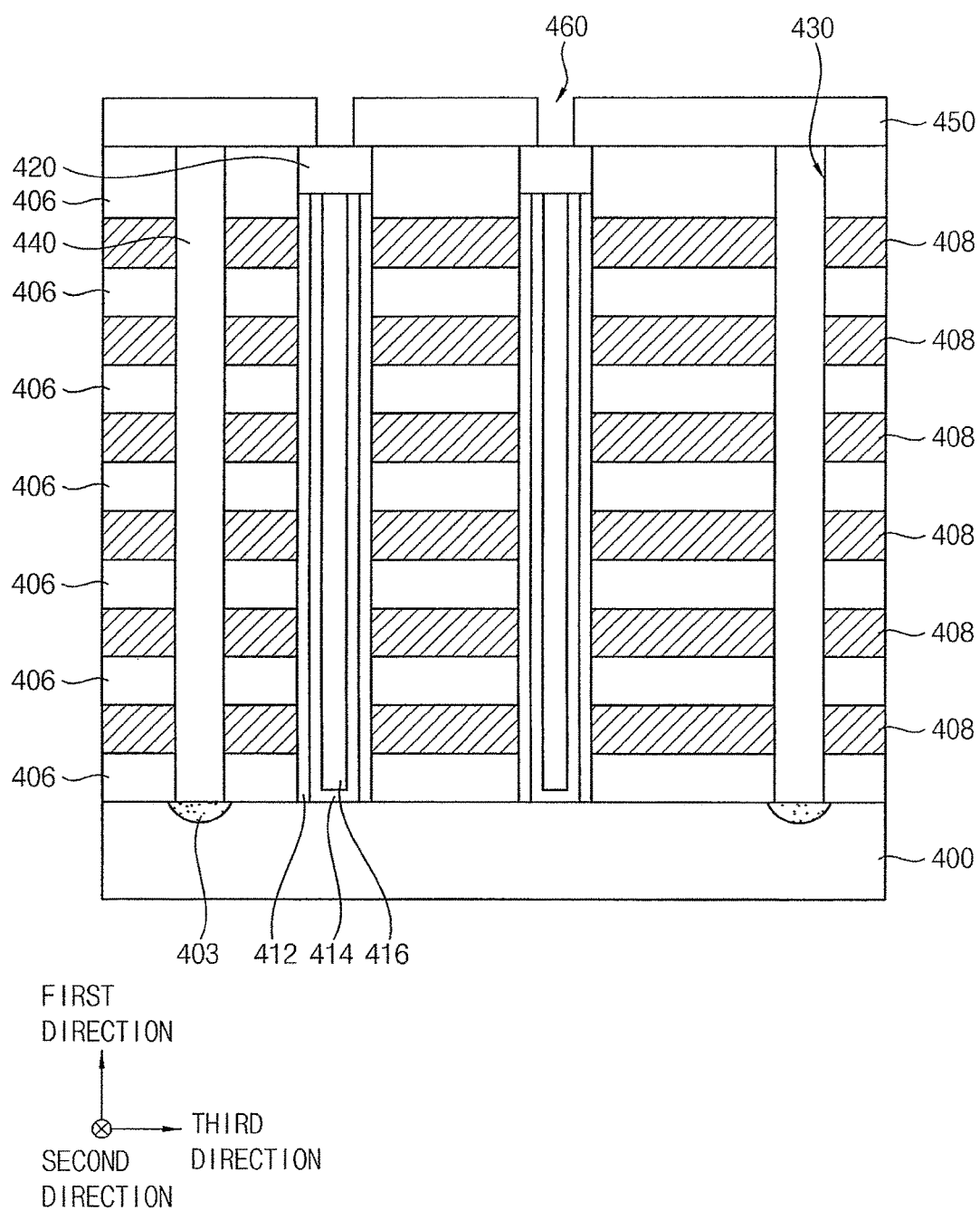

Referring to FIGS. 50 and 51, an upper insulation layer 450 may be formed on the uppermost insulating interlayer 406, the cutting insulation patterns 440, and the pads 420. The upper insulation layer 450 may be formed of, e.g., silicon oxide. The upper insulation layer 450 may be partially etched to form contact holes 460 through which the pads 420 may be exposed. The contact holes 460 may be formed using the upper insulation layer as an object layer by the method of forming patterns illustrated with reference to FIGS. 1 to 17, FIGS. 22 to 25 and/or FIGS. 26 to 37. Detailed descriptions on the method are not repeated herein.

Figure 52:
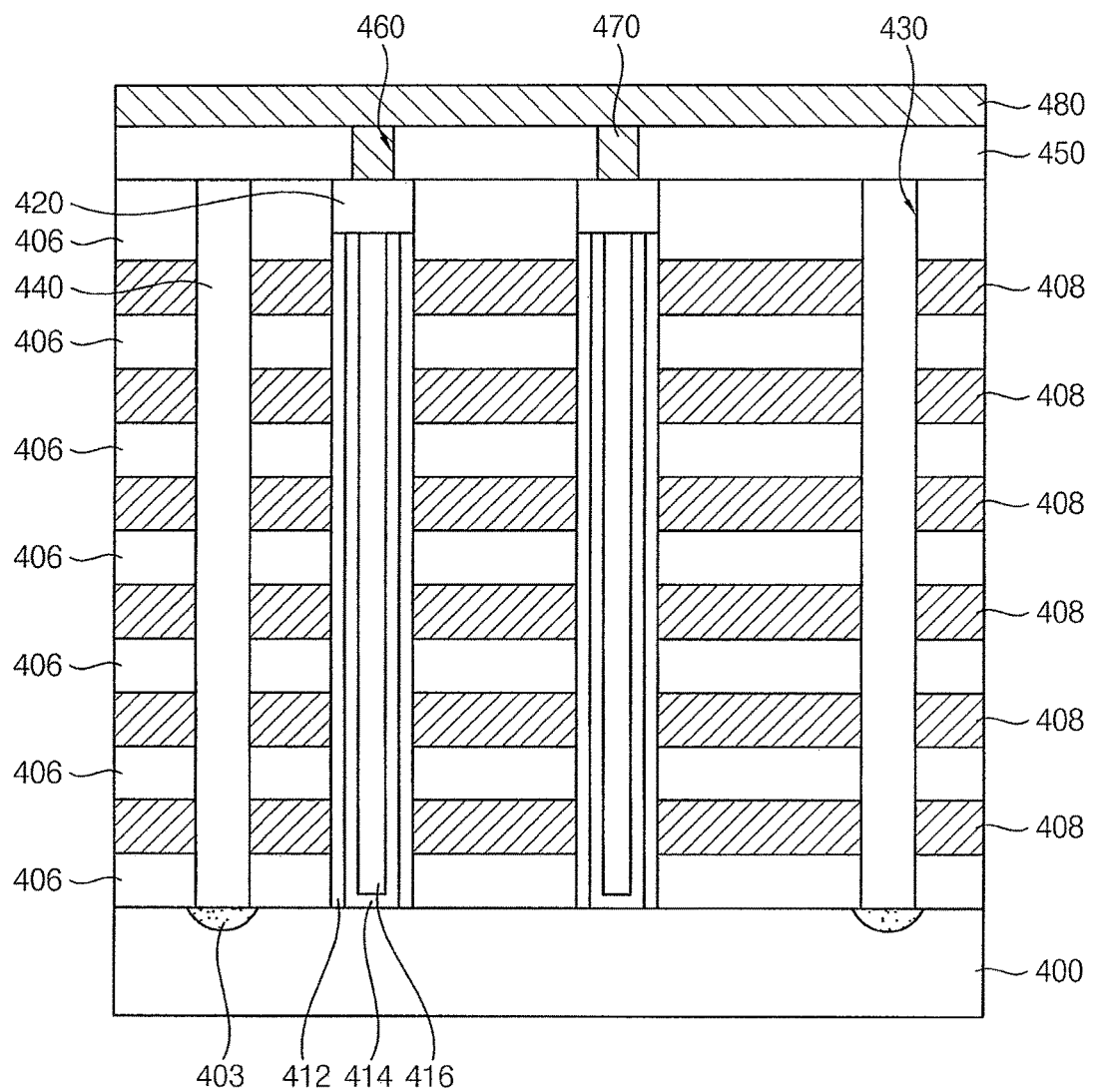

Referring to FIG. 52, a contact 470 electrically connected to the pad 420 may be formed in each contact hole 460. A bit line 480 electrically connected to a plurality of the contacts 470 may be formed on the upper insulation layer 450. The bit line 480 may extend in the third direction, and a plurality of the bit lines 480 may be formed along the second direction. The contact 470 and the bit line 480 may be formed of a conductive material such as a metal, a metal nitride or doped polysilicon.

Hereinafter, methods of forming patterns according to example embodiments are described in more detail using Experimental Examples. Conditions and numerical values included in Experimental Examples are not limiting the present inventive concepts.

Experimental Example 1: Evaluation on Properties of Brush Layers

Guide patterns having a pillar shape were formed of silicon oxide on a silicon wafer. Brush layers using the brush polymers of Example 1 (PS-diOH brush polymer represented by the above Chemical Formula 3), Example 2 (PS-r-HEMA brush Polymer represented by the above Chemical Formula 5) and Comparative Example 1 (PS—OH brush polymer represented by Chemical Formula 6 below)

were formed on surfaces of the guide patterns. A reaction temperature at which a thickness of each brush layer was saturated on the guide patterns was measured, and a contact angle with respect to water of the each brush layer having a saturated thickness was measured. The results are shown in Table 1 below.

[Chemical Formula 6]

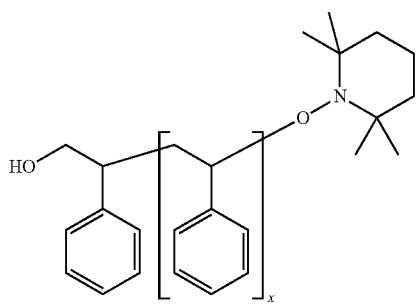

TABLE 1

|  | Reaction Temperature | Contact Angle |
| --- | --- | --- |
| Comparative Example 1 | about 210° C. | 85° |
| Example 1 | about 180° C. to about 200° C. | 87.4° |
| Example 2 | about 150° C. to about 180° C. | 86.1° |

Referring to Table 1, each contact angle of Examples 1 and 2 was greater than that of Comparative Example 1, and thus the brush layers of Examples 1 and 2 provided more stable hydrophobicity. Further, the brush polymer of Comparative Example 1 had the relatively high reaction temperature, and thus a high temperature was needed for the formation of the desired brush layer, which could cause a less mechanical stability of the brush layer.

The brush polymer of Example 1 was advantageous from an aspect of the contact angle, and the brush polymer of Example 2 was advantageous from an aspect of the reaction temperature. Therefore, it may be acknowledged that a brush layer having improved reactivity and hydrophobicity may be obtained by using a blend of the PS-diOH brush polymer and the PS-r-HEMA brush polymer, or a polymer in which the PS-diOH and the PS-r-HEMA structures are incorporated in the same chain.

Experimental Example 2: Evaluations on PMMA Alignment Failures According to Types of Block Copolymers Oxide guide patterns, each of which had a diameter of 70 nm, were formed. A self-aligned layer was formed using a lamellar-type block copolymer in which a volume ratio of PS and PMMA was 55:45. A unit length at which PMMA blocks of a pillar shape was observed was measured varying a unit length of the lamellar-type block copolymer. The PMMA blocks of the pillar shape were observed when the unit length reached about 50 nm. Thus, a self-alignment of the pillar shape was induced by controlling a ratio of the diameter of the guide patterns and the unit length of the block copolymer, even though the lamellar-type block copolymer was used.

Based on the results above, a brush layer of the PS-diOH structure having a thickness of 10 nm was formed on the oxide guide patterns. An alignment failure was evaluated using a pure lamellar-type PS-b-PMMA, and a blend of the lamellar-type block copolymer and homopolymers thereof. PMMA and PS each of which had a weight average molecular weight of 2,000 were used as the homopolymers.

Figure 53A:
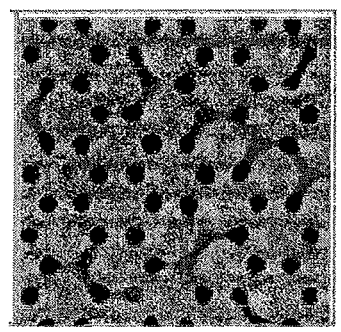
FIGS. 53A and 53B are images of phase separations when a pure lamellar-type block copolymer was used.
Figure 53B:
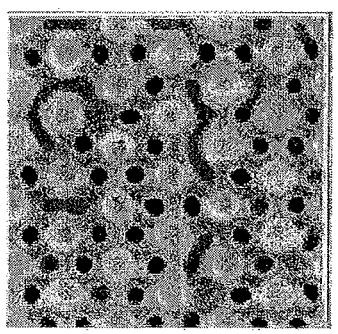

FIGS. 53A and 53B are images showing phase separations when a pure lamellar-type block copolymer was used. Specifically, FIGS. 53A and 53B are images of phase separations of the pure lamellar-type block copolymers having unit lengths of 51 nm and 54 nm, respectively.

Referring to FIGS. 53A and 53B, some of PMMA pillars aligned around the guide patterns were connected to cause a bridge, or some of the PMMA pillars were omitted.

Figure 54A:
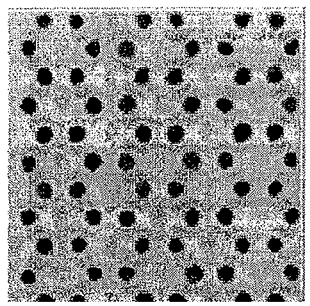
FIGS. 54A and 54B are images of phase separations when a blend of a block copolymer and homopolymers was used.
Figure 54B:
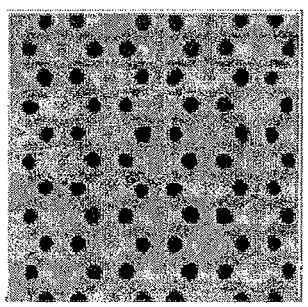

FIGS. 54A and 54B are images showing phase separations when a blend of a block copolymer and homopolymers. FIGS. 54A and 54B are images of phase separations of the blend that included the lamellar-type block copolymers having unit lengths of 51 nm and 54 nm, respectively. Referring to FIGS. 54A and 54B, when a ternary blend including the lamellar-type block copolymer and the homopolymers was used, PMMA pillars forming a hexagonal unit were achieved without a bridge and an omission of pillars.

Experimental Example 3: Evaluations on PMMA Alignment Failures According to Types of Brush Layers and Block Copolymers A silicon carbonitride (SiCN) layer was formed on a wafer, and oxide guide patterns each of which had a diameter of 70 nm were formed on the silicon carbonitride layer. A brush layer was formed on surface of the guide patterns, and a blend of a cylinder-type PS-b-PMMA (a volume ratio of PS and PMMA=7:3) and a blend of a lamellar-type PS-b-PMMA (a volume ratio of PS and PMMA=55:45) were phase-separated on the brush layer. PMMA pillars were removed to form holes, and the silicon carbonitride layer was etched through the holes, and then the number of not-open failures or bridges in a unit area of the wafer was measured. The results are shown in Table 2 below.

TABLE 2

| Block Copolymer | Brush Polymer | Number of Failures |
|---|---|---|
| Cylinder-Type Ternary Blend | PS-OH | >125,000 |
| | PS-HEMA | 827 |
| | PS-diOH | 4,802 |
| | PS-HEMA (30 wt %) + PS-diOH (70 wt %) | 655 |
| | PS-HEMA (70 wt %) + PS-diOH (30 wt %) | 561 |
| Lamellar-Type Ternary Blend | PS-HEMA | 929 |
| | PS-diOH | 361 |

Referring to Table 2, when the cylinder-type blend was used, alignment failures were reduced by utilizing the PS-HEMA brush polymer or the PS-diOH brush polymer. The alignment failures were further reduced by using a combination of the PS-HEMA and PS-diOH brush polymers. When the lamellar-type ternary blend was used in a combination with, e.g., the PS-diOH brush polymer, the alignment failures were less than those in the case of using the cylinder-type ternary blend.

Direct self assembly (DSA) using a block copolymer has been developed. According to example embodiments, a brush layer may be formed on guide patterns using a brush polymer that may include a terminal group having at least two hydroxyl groups or a hydroxy-alkyl methacrylate insertion group. The brush layer may have improved reactivity and/or adhesion with respect to the guide patterns, and may facilitate a phase-separation and a self-alignment of polymer units such as PMMA. Additionally, a blend of a block copolymer having a ratio of PS and PMMA near about 1:1 and homopolymers may be used in a DSA process so that an alignment failure caused by an insufficient amount of PMMA may be prevented. As described above, example embodiments relate to methods of forming patterns including a self-alignment method, the patterns having fine dimension with high reliability. Example embodiments provide a method of manufacturing a semiconductor device utilizing the method of forming patterns, and a composition for forming a hydrophilic brush layer capable of being used in the method of forming patterns.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A method of forming patterns, the method comprising:
forming an object layer on a substrate;
forming guide patterns on the object layer;
forming a brush layer using a brush polymer on surfaces of the guide patterns, the brush polymer including at least one of a first brush polymer or a second brush polymer, the first brush polymer including a hydrophobic repeating unit and a hydrophilic terminal group having at least two hydroxyl groups, the second brush polymer including a hydrophobic repeating unit and a hydrophilic random repeating unit having a hydroxyl group, wherein the hydrophobic repeating unit of the first and second brush polymers includes a styrene unit represented by Chemical Formula 1:

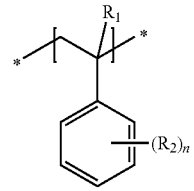

[Chemical Formula 1]

wherein, in Chemical Formula 1, $R_1$ is hydrogen, a C1-C6 alkyl group, or a C1-C6 halogenated alkyl group, $R_2$ is a halogen atom, an oxygen atom, a C1-C20 alkyl group or a cycloalkyl group, or a C1-C20 alkyl group or a cycloalkyl group including a halogen substitution group or being partially substituted with a silicon atom, and n is an integer of 0 and 5;
forming a self-aligned layer using a block copolymer on the brush layer and heating the self-aligned layer to form blocks aligned around the guide patterns, wherein the block copolymer includes a first polymer unit and a second polymer unit, the first polymer unit being assembled into first blocks arranged in a grid shape or a honeycomb shape around the guide patterns, the second polymer unit being assembled into second blocks contacting the brush layer and surrounding sidewalls of the first blocks;

removing the first blocks; and etching the object layer.

2. The method as claimed in claim 1, wherein the hydrophilic terminal group having at least two hydroxyl groups is represented by Chemical Formula 2:

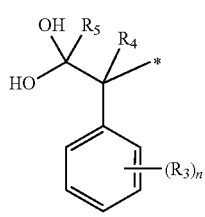

[Chemical Formula 2]

wherein, in Chemical Formula 2, $R_4$ is hydrogen, a C1-C6 alkyl group, or a C1-C6 halogenated alkyl group, $R_3$ is a halogen atom, an oxygen atom, a C1-C20 alkyl group or a cycloalkyl group, or a C1-C20 alkyl group or a cycloalkyl group including a halogen substitution group or being partially substituted with a silicon atom, $R_5$ is a hydroxyl group or hydrogen, and n is an integer of 0 and 5.

3. The method as claimed in claim 2, wherein the first brush polymer is represented by Chemical Formula 3:

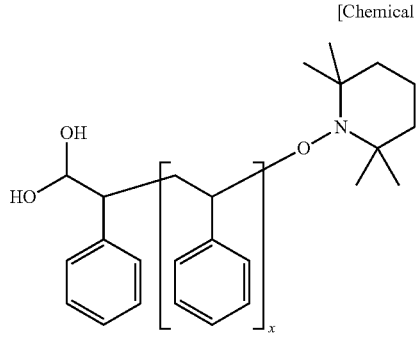

[Chemical Formula 3]

wherein, in Chemical Formula 3, x is an integer adjusted such that a weight average molecular weight of the first brush polymer is of about 1,000 to about 100,000.

4. The method as claimed in claim 1, wherein the hydrophilic random repeating unit is represented by Chemical Formula 4:

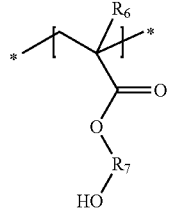

[Chemical Formula 4]

wherein, in Chemical Formula 4, $R_6$ is hydrogen, a C1-C6 alkyl group, or a C1-C6 halogenated alkyl group, and $R_7$ is C1-C5 alkylene.

5. The method as claimed in claim 4, wherein the second brush polymer includes a moiety represented by Chemical Formula 5:

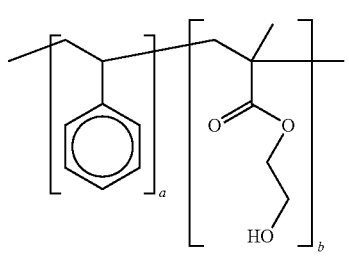

[Chemical Formula 5]

wherein, in Chemical Formula 5, "a" and "b" represent molar ratios, and a/b is of about 94/6 to about 99/1.

6. The method as claimed in claim 1, wherein the first polymer unit includes polymethylmethacrylate (PMMA), and the second polymer unit includes polystyrene (PS), wherein an outer surface of the brush layer includes PS.

7. The method as claimed in claim 1, wherein the self-aligned layer is formed using a blend of the block copolymer and homopolymers.

8. The method as claimed in claim 7, wherein the homopolymers include a first homopolymer including the first polymer unit, and a second homopolymer including the second polymer unit.

9. The method as claimed in claim 1, wherein the self-aligned layer is formed using a blend of the block copolymer and an additional block copolymer having a weight average molecular weight less than that of the block copolymer, wherein the additional block copolymer includes the first polymer unit and the second polymer unit, each of which has a weight average molecular weight of about 1,000 to about 10,000.

10. A method of forming patterns, the method comprising:

forming an object layer on a substrate;

forming guide patterns on the object layer;

forming a brush layer using a brush polymer on surfaces of the guide patterns, the brush polymer including at least one of a first brush polymer or a second brush polymer, the first brush polymer including a hydrophobic repeating unit and a hydrophilic terminal group having at least two hydroxyl groups, the second brush polymer including a hydrophobic repeating unit and a hydrophilic random repeating unit having a hydroxyl group;

forming a self-aligned layer using a block copolymer on the brush layer and heating the self-aligned layer to form blocks aligned around the guide patterns, wherein the block copolymer includes a first polymer unit and a second polymer unit, the first polymer unit being assembled into first blocks arranged in a grid shape or a honeycomb shape around the guide patterns, the second polymer unit being assembled into second blocks contacting the brush layer and surrounding sidewalls of the first blocks;

removing the first blocks; and etching the object layer, wherein the brush polymer includes a blend of the first brush polymer and the second brush polymer.

11. A method of forming patterns, the method comprising:

forming an object layer on a substrate;

forming guide patterns on the object layer;

forming a brush layer using a brush polymer on surfaces of the guide patterns, the brush polymer including at least one of a first brush polymer or a second brush polymer, the first brush polymer including a hydrophobic repeating unit and a hydrophilic terminal group having at least two hydroxyl groups, the second brush polymer including a hydrophobic repeating unit and a hydrophilic random repeating unit having a hydroxyl group;

forming a self-aligned layer using a block copolymer on the brush layer and heating the self-aligned layer to form blocks aligned around the guide patterns, wherein the block copolymer includes a first polymer unit and a second polymer unit, the first polymer unit being assembled into first blocks arranged in a grid shape or a honeycomb shape around the guide patterns, the second polymer unit being assembled into second blocks contacting the brush layer and surrounding sidewalls of the first blocks;

removing the first blocks; and etching the object layer, wherein the brush polymer includes a polymer in which the first brush polymer and the second brush polymer are incorporated in a single structure.

12. A method of forming patterns, the method comprising:

forming an object layer on a substrate;

forming guide patterns on the object layer;

forming a brush layer covering surfaces of the guide patterns;

forming a self-aligned layer on the brush layer using a blend, the blend including:
- a lamellar-type block copolymer including a first polymer unit and a second polymer unit;
- a first homopolymer including the first polymer unit; and
- a second homopolymer including the second polymer unit;

thermally curing the self-aligned layer to form first blocks including the first polymer unit and a second block including the second polymer unit, the first blocks being aligned around guide pattern in a honeycomb shape and each first block having a pillar shape, the second block contacting the brush layer and surrounding the first blocks;

removing the first blocks; and etching the object layer, wherein the brush layer is formed using a brush polymer, the brush polymer including at least one of a first brush polymer or a second brush polymer, the first brush polymer including a hydrophobic repeating unit and a hydrophilic terminal group having at least two hydroxyl groups, the second brush polymer including a hydrophobic repeating unit and a hydrophilic random repeating unit having a hydroxyl group, and wherein the first brush polymer has a structure in which a diol group is combined with PS as terminal group (PS-diOH), and the second brush polymer has a structure in which a hydroxy-alkyl methacrylate unit is randomly inserted in a PS backbone.

13. The method as claimed in claim 12, wherein the first polymer unit includes polymethylmethacrylate (PMMA), and the second polymer unit includes polystyrene (PS), wherein a volume ratio of PMMA in the lamellar-type block copolymer is in a range of about 35% to about 65%.

14. The method as claimed in claim 12, wherein forming the guide patterns includes adjusting a diameter of each guide pattern within a predetermined range of a unit length of the lamellar-type block copolymer.

15. The method as claimed in claim 14, wherein a ratio of the diameter of the each guide pattern with respect to the unit length is of about 0.5 to about 1.5.

* * * * *